US012800664B2

(12) United States Patent
Matsumura et al.

(10) Patent No.: US 12,800,664 B2
(45) Date of Patent: Nov. 17, 2026

(54) MANUFACTURING METHOD, GENERATION DEVICE, ESTIMATION DEVICE, IDENTIFICATION INFORMATION IMPARTING METHOD, AND IMPARTING DEVICE

(71) Applicant: Panasonic Intellectual Property Corporation of America, Torrance, CA (US)

(72) Inventors: Sowyo Matsumura, Osaka (JP); Junichi Imoto, Osaka (JP)

(73) Assignee: PANASONIC INTELLECTUAL PROPERTY CORPORATION OF AMERICA, Torrance, CA (US)

( * ) Notice: Subject to any disclaimer, the term of this patent is extended or adjusted under 35 U.S.C. 154(b) by 525 days.

(21) Appl. No.: 18/380,436

(22) Filed: Oct. 16, 2023

(65) Prior Publication Data

US 2024/0044989 A1 Feb. 8, 2024

Related U.S. Application Data

(63) Continuation of application No. PCT/JP2022/013916, filed on Mar. 24, 2022.

(30) Foreign Application Priority Data

Apr. 19, 2021 (JP) ................................ 2021-070172

(51) Int. Cl.
*G01R 31/367* (2019.01)
*G06N 20/00* (2019.01)
*H01M 10/48* (2006.01)

(52) U.S. Cl.
CPC ........... *G01R 31/367* (2019.01); *G06N 20/00* (2019.01); *H01M 10/48* (2013.01)

(58) Field of Classification Search
CPC ...... G01R 31/367; G06N 20/00; H01M 10/48
See application file for complete search history.

(56) References Cited

U.S. PATENT DOCUMENTS

2013/0268466 A1* 10/2013 Baek .................... G01R 31/392 706/12
2016/0202324 A1 7/2016 Biletska et al.
(Continued)

FOREIGN PATENT DOCUMENTS

JP 2016-536605 11/2016
JP 2020-107577 7/2020
(Continued)

OTHER PUBLICATIONS

International Search Report issued in International Pat. Appl. No. PCT/JP2022/013916, dated Jun. 21, 2022, along with annglish translation thereof.

*Primary Examiner* — Kenneth B Lee, Jr.
(74) *Attorney, Agent, or Firm* — Greenblum & Bernstein, P.L.C.

(57) ABSTRACT

A generation device includes: an acquisition unit that acquires one or more pieces of identification information imparted to a component in a certain hierarchy among a plurality of components, the one or more pieces of identification information being identification information identifiably imparted with the type and the number of components in a lower hierarchy; a generation unit that generates a trained model corresponding to each piece of identification information for estimating a state of a battery by learning operating data for each of the one or more pieces of identification information; and an output unit that outputs the generated trained model.

15 Claims, 14 Drawing Sheets

(56) References Cited

U.S. PATENT DOCUMENTS

| | | | | |
|---|---|---|---|---|
| 2016/0231385 | A1* | 8/2016 | Bulur | G01R 31/396 |
| 2019/0033377 | A1 | 1/2019 | Karner et al. | |
| 2019/0033381 | A1 | 1/2019 | Karner et al. | |
| 2019/0033382 | A1 | 1/2019 | Karner et al. | |
| 2019/0033383 | A1 | 1/2019 | Karner et al. | |
| 2019/0033384 | A1 | 1/2019 | Karner et al. | |
| 2019/0033385 | A1 | 1/2019 | Karner et al. | |
| 2019/0033388 | A1 | 1/2019 | Karner et al. | |
| 2019/0033393 | A1 | 1/2019 | Karner et al. | |
| 2019/0033394 | A1 | 1/2019 | Karner et al. | |
| 2019/0033395 | A1* | 1/2019 | Karner | G01R 31/392 |
| 2019/0033396 | A1 | 1/2019 | Karner et al. | |
| 2019/0033397 | A1 | 1/2019 | Karner et al. | |
| 2019/0035237 | A1 | 1/2019 | Karner et al. | |
| 2019/0036178 | A1 | 1/2019 | Karner et al. | |
| 2020/0251360 | A1* | 8/2020 | Liao | G05B 23/024 |
| 2021/0050734 | A1* | 2/2021 | Huot-Marchand | H01M 10/4257 |
| 2022/0058525 | A1 | 2/2022 | Yonetani et al. | |
| 2022/0082625 | A1* | 3/2022 | Kurisawa | G01R 31/367 |
| 2022/0404426 | A1 | 12/2022 | Karner et al. | |

FOREIGN PATENT DOCUMENTS

| | | |
|---|---|---|
| JP | 2020-115311 | 7/2020 |
| JP | 2020-529022 | 10/2020 |
| WO | 2020/159730 | 8/2020 |

* cited by examiner

MANUFACTURING METHOD, GENERATION DEVICE, ESTIMATION DEVICE, IDENTIFICATION INFORMATION IMPARTING METHOD, AND IMPARTING DEVICE

TECHNICAL FIELD

The present disclosure relates to a technique for generating a trained model of a battery including a plurality of components configured in a hierarchical structure.

BACKGROUND ART

Patent Literature 1 discloses a technique for acquiring a measurement value of a battery, determining an operating regime of the battery from the acquired measurement value, selecting a nonlinear regression model according to the determined operating regime, inputting the measurement value to the selected nonlinear regression model, and estimating a state of charge of the battery.

However, since the nonlinear regression model of Patent Literature 1 is not generated in consideration of differences in the type and number of components constituting the battery, further improvement is necessary for enhancing the estimation accuracy of the state of charge.

CITATION LIST

Patent Literature

Patent Literature 1: Japanese Patent Application Laid-Open No. 2016-536605

SUMMARY OF INVENTION

The present disclosure has been made in view of such a problem, and an object thereof is to provide a technique for generating a trained model capable of high accurately estimating a state of a battery.

A manufacturing method according to an aspect of the present disclosure is a manufacturing method of a trained model in a generation device that generates the trained model of a battery including a plurality of components configured hierarchically, the manufacturing method including: by a processor of the generation device, acquiring one or more pieces of identification information imparted to a component of a certain hierarchy among the plurality of components, acquiring operating data of the battery corresponding to each piece of identification information, generating a trained model corresponding to each piece of identification information for estimating a state of the battery by learning, for each of the one or more pieces of identification information, the operating data having been acquired, and outputting the trained model having been generated.

According to the present disclosure, it is possible to generate a trained model capable of high accurately estimating a state of a battery.

DESCRIPTION OF EMBODIMENTS

Knowledge Underlying Present Disclosure

Figure 1:
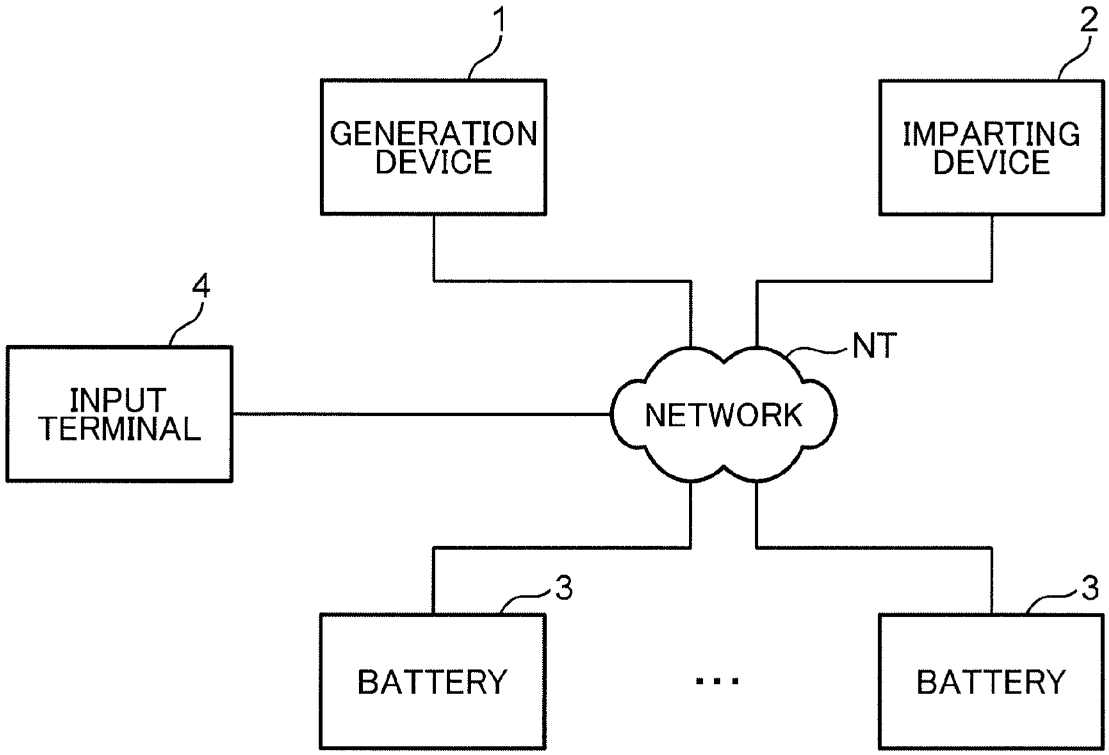
FIG. 1 is a view illustrating an example of an overall configuration of an information processing system in a first embodiment of the present disclosure.

In recent years, it has been studied to generate a trained model for highly accurately estimating a state of a battery such as an SOC from operating data by collecting operating data of various types of batteries manufactured by various manufacturers and learning the collected operating data. The battery is hierarchically constituted by a plurality of components such as a cell, a block including a cell, a module including a block, and a battery pack including a module. Here, when the number of components constituting the battery and the type of each component are different, the characteristics of the battery also vary according to the difference. Therefore, when the trained model is generated using the operating data as learning data without considering such a difference in characteristics, there is a possibility that the trained model for highly accurately estimating the state of the battery cannot be obtained.

In Patent Literature 1 described above, a nonlinear regression model is selected according to an operating regime determined from a measurement value of a battery. However, the operating regime is defined by at least one parameter selected from among the state of charge of the battery, the fact that the battery is charging or discharging, the charging rate or discharging rate, the ambient temperature or internal temperature, the average value of the voltage measurement values of the battery, and the impedance of the battery or the measurement value of the health of the battery. Therefore, the nonlinear regression model of Patent Literature 1 does not take into account differences in the number and type of components constituting the battery, and cannot highly accurately estimate the state of the battery.

The present disclosure has been made to solve such a problem, and an object of the present disclosure is to provide a technique for generating a trained model capable of highly accurately estimating the state of a battery.

A manufacturing method according to an aspect of the present disclosure is a manufacturing method of a trained model in a generation device that generates the trained model of a battery including a plurality of components configured hierarchically, the manufacturing method including: by a processor of the generation device, acquiring one or more pieces of identification information imparted to a component of a certain hierarchy among the plurality of components, acquiring operating data of the battery corresponding to each piece of identification information, generating a trained model corresponding to each piece of identification information for estimating a state of the battery by learning, for each of the one or more pieces of identification information, the operating data having been acquired, and outputting the trained model having been generated.

According to this configuration, one or more pieces of identification information imparted to a component of a certain hierarchy among the plurality of components are acquired, the operating data of the battery corresponding to the acquired identification information is acquired, and the trained model corresponding to each piece of identification information is generated by learning the acquired operating data for each piece of identification information. This can generate a trained model for each piece of identification information in consideration of differences in the number and type of components constituting a battery. As a result, it is possible to generate a trained model capable of highly accurately estimating the state of the battery.

In the above manufacturing method, each piece of identification information may be identifiably imparted with a type and a number of components in a lower hierarchy.

According to this configuration, each piece of identification information is identifiably imparted with the type and the number of components in a lower hierarchy. Therefore, it is possible to acquire operating data of the same type and number as the components of the lower hierarchy. This can generate a trained model for each piece of identification information using operating data of batteries having the same type and number of components in a lower hierarchy.

In the above manufacturing method, a first trained model corresponding to each piece of first identification information may be generated based on the operating data corresponding to one or more pieces of first identification information in a first hierarchy, a training cost or a training error of the first trained model may be calculated, and when the training cost or the training error having been calculated is larger than a threshold, a second trained model corresponding to each piece of second identification information may be generated based on the operating data corresponding to one or more pieces of second identification information in a second hierarchy different from the first hierarchy.

According to this configuration, when the training cost or the training error of the first trained model generated based on the operating data corresponding to each piece of first identification information of the first hierarchy is larger than the threshold, the trained model corresponding to each piece of second identification information of the second hierarchy is generated. This can search for a trained model of another hierarchy capable of further reducing the training cost or the training error.

In the above manufacturing method, the plurality of components may include a first component and a second component having a hierarchy different from a hierarchy of the first component, the one or more pieces of first identification information may be information for identifying the first component, and the one or more pieces of second identification information may be information for identifying the second component.

According to this configuration, it is possible to search for a trained model of another hierarchy capable of further reducing the training cost or the training error.

In the above manufacturing method, in the generation, when the training cost or the training error of the first trained model is equal to or less than the threshold, the first trained model may be determined as the trained model of a learning target.

According to this configuration, when the training cost or the training error of the first trained model is equal to or less than the threshold, the first trained model is determined as the trained model of a generation target. Therefore, it is thereafter possible to generate and update the first trained model using the operating data corresponding to the first identification information, and it is possible to generate the trained model with low training cost or high accuracy.

In the above manufacturing method, in the generation, when an accuracy of the second trained model is lower than a reference accuracy, a third trained model corresponding to each third identification information may be generated based on the operating data corresponding to one or more pieces of third identification information of a third hierarchy different from the first hierarchy and the second hierarchy.

According to this configuration, when the accuracy of the second trained model generated based on the operating data corresponding to each piece of the second identification information is lower than the reference accuracy, the third trained model corresponding to each piece of the third identification information is generated. This can search for a trained model of another hierarchy capable of further reducing the training cost or the training error while changing the hierarchy.

In the above manufacturing method, in the generation, when an accuracy of the second trained model is higher than a reference accuracy, the second trained model may be determined as the trained model of a learning target.

According to this configuration, when the accuracy of the second trained model is higher than the reference accuracy, the second trained model is determined as the trained model of a generation target. Therefore, it is thereafter possible to update the second trained model using the operating data corresponding to each piece of the second identification information, and it is possible to generate a more highly accurate trained model.

In the above manufacturing method, the training cost may be calculated based on at least any one of a number of models of the trained models having been generated, a data amount of operating data used for generation of the trained model, and a processing load of the processor when generating the trained model.

According to this configuration, since the training cost is calculated based on at least one of a number of models of the trained models having been generated, a data amount of operating data used for generation of the trained model, and a processing load when generating the trained model, the training cost can be accurately estimated.

In the above manufacturing method, the one or more pieces of identification information include one or more pieces of type identification information for identifying each component by type.

According to this configuration, it is possible to easily acquire operating data of each component by type.

In the above manufacturing method, each piece of identification information includes one or more pieces of individual identification information for identifying each component individually.

According to this configuration, it is possible to easily acquire operating data of each component individually.

In the above manufacturing method, the plurality of components may include a cell, a block including the cell, a module including the block, and a battery pack including the module.

According to this configuration, it is possible to generate the trained model using the operating data corresponding to any hierarchy of the cell, the block, the module, and the battery pack.

A generation device according to another aspect of the present disclosure is a generation device that generates a trained model of a battery including a plurality of components configured hierarchically, the generation device including: a processor, in which the processor executes processing of acquiring one or more pieces of identification information imparted to a component of a certain hierarchy among the plurality of components, acquiring operating data corresponding to each piece of identification information, generating the trained model corresponding to each piece of identification information for estimating a state of the battery by learning, for each of the one or more pieces of identification information, the operating data having been acquired, and outputting the trained model having been generated.

According to this configuration, it is possible to provide a generation device capable of obtaining the operations and effects of the above-described manufacturing method.

An estimation device according to still another aspect of the present disclosure is an estimation device that estimates a state of a battery including a plurality of components configured hierarchically, the estimation device including a processor, in which the processor executes processing of acquiring operating data of the battery, inputting the operating data into a trained model to estimate a state of the battery, and outputting state information indicating an estimated state, and the trained model is a model generated by learning, for each of one or more pieces of identification information, the operating data corresponding to the one or more pieces of identification information imparted to a component of a certain hierarchy among the plurality of components.

According to this configuration, it is possible to estimate the state of the battery using the trained model generated using the operating data corresponding to one or more pieces of identification information imparted to a certain hierarchy. This can highly accurately estimate the state of a battery using the trained model learned in consideration of differences in the number and type of components constituting the battery.

An identification information impartment method according to still another aspect of the present disclosure is an identification information imparting method in an imparting device that imparts identification information of a battery including a first component and a second component including the first component, the identification information imparting method including: acquiring first configuration information indicating a configuration corresponding to a type of the first component; generating first identification information for identifying the first component by type based on the first configuration information; outputting the first identification information; acquiring second configuration information indicating a configuration corresponding to a type of the second component, the second configuration information including the first identification information and a number of the first components; generating second identification information for identifying the second component by type based on the second configuration information; and outputting the second identification information.

According to this configuration, the first identification information for identifying the first component by type is generated based on the first configuration information. The second identification information for identifying the second component by type is generated based on the second configuration information. Here, the second configuration information includes the first identification information of the first component and the number of the first components.

Therefore, it is possible to easily acquire the operating data of the batteries having the same type and number of the first components, which are lower components. This can generate a trained model in consideration of differences in the type and number of components constituting the battery.

In the identification information imparting method, the battery may further include a third component including the second component, the method may further include acquiring third configuration information indicating a configuration corresponding to a type of the third component, the third configuration information including the second identification information, a number of the second components, and connection information indicating a connection mode of the second component, generating third identification information for identifying the third component by type based on the third configuration information, and outputting the third identification information.

According to this configuration, the third identification information for identifying the third component by type is generated based on the third configuration information. Here, the third configuration information includes the second identification information, the number of second components, and the connection information of the second components.

Therefore, it is possible to easily acquire the operating data of the batteries having the same connection mode in addition to the type and number of the second components, which are the lower components. This can generate a trained model in consideration of differences in the type, number, and connection mode of the components constituting the battery.

The identification information imparting method may further include: acquiring fourth configuration information indicating a configuration corresponding to an individual of the third component, the fourth configuration information including the third identification information and a manufacturing number of the third component; generating fourth identification information for identifying the third component individually based on the fourth configuration information; and outputting the fourth identification information.

According to this configuration, since the fourth identification information is generated using the fourth configuration information including the third identification information and the manufacturing number of the third component, it is possible to easily acquire the operating data of the third component individually.

The identification information imparting method may further include: acquiring fifth configuration information indicating a configuration corresponding to an individual of the second component, the fifth configuration information including the fourth identification information and a manufacturing number of the second component; generating fifth identification information for identifying the second component individually based on the fifth configuration information; and outputting the fifth identification information.

According to this configuration, since the fifth identification information is generated using the fourth configuration information including the fourth identification information and the manufacturing number of the second component, it is possible to easily acquire the operating data of the second component individually.

An imparting device according to still another aspect of the present disclosure is an imparting device that imparts identification information of a battery including a first component and a second component including the first component, the imparting device including a processor, in which the processor executes processing of acquiring first configuration information indicating a configuration corresponding to a type of the first component, generating first identification information for identifying the first component by type based on the first configuration information, outputting the first identification information, acquiring second configuration information indicating a configuration corresponding to a type of the second component, the second configuration information including the first identification information and a number of the first components, generating second identification information for identifying the second component by type based on the second configuration information, and outputting the second identification information.

According to the present configuration, it is possible to provide an imparting device that can obtain the same operations and effects as those of the above-described identification information imparting method.

The present disclosure can also be achieved as a program for causing a computer to execute each characteristic configuration included in the manufacturing method, the estimation device, the identification information imparting method, and the imparting device, or a system operated by this program. In addition, it is needless to say that such a computer program can be distributed using a computer-readable non-transitory recording medium such as a CD-ROM, or via a communication network such as the Internet.

Each of embodiments to be described below illustrates a specific example of the present disclosure. Numerical values, shapes, components, steps, an order of steps, and the like shown in the embodiments below are merely examples, and are not intended to limit the present disclosure. Furthermore, among components in the embodiments below, a component that is not described in an independent claim indicating the most significant concept will be described as an optional component. Furthermore, in all the embodiments, the respective contents can be combined.

First Embodiment

FIG. 1 is a view illustrating an example of an overall configuration of the information processing system in the first embodiment of the present disclosure. The information processing system includes a generation device 1, an imparting device 2, one or more batteries 3, and an input terminal 4. The generation device 1 to the input terminal 4 are communicably connected via a network NT. The network NT includes, for example, a wide-area communication network including an Internet communication network and a mobile phone communication network.

The generation device 1 is, for example, a cloud server including one or more computers. The generation device 1 generates a trained model for estimating the state of the battery using operating data of the battery, and transmits the generated trained model to the imparting device 2. The imparting device 2 is, for example, a cloud server including one or more computers. The imparting device 2 imparts identification information to each of the batteries 3. The imparting device 2 acquires the operating data of the battery 3 from the battery 3 and accumulates the operating data into a memory. The imparting device 2 transmits the accumulated operating data to the generation device 1 as necessary. The imparting device 2 transmits the trained model received from the generation device 1 to the battery 3.

The battery 3 is mounted on a vehicle, for example. The battery 3 includes a plurality of components configured hierarchically. The vehicle is, for example, an electric car, an electric bicycle, an electric kickboard, or the like. The input terminal 4 receives input of the configuration information of the battery 3 and transmits the received configuration information to the imparting device 2.

Figure 2:
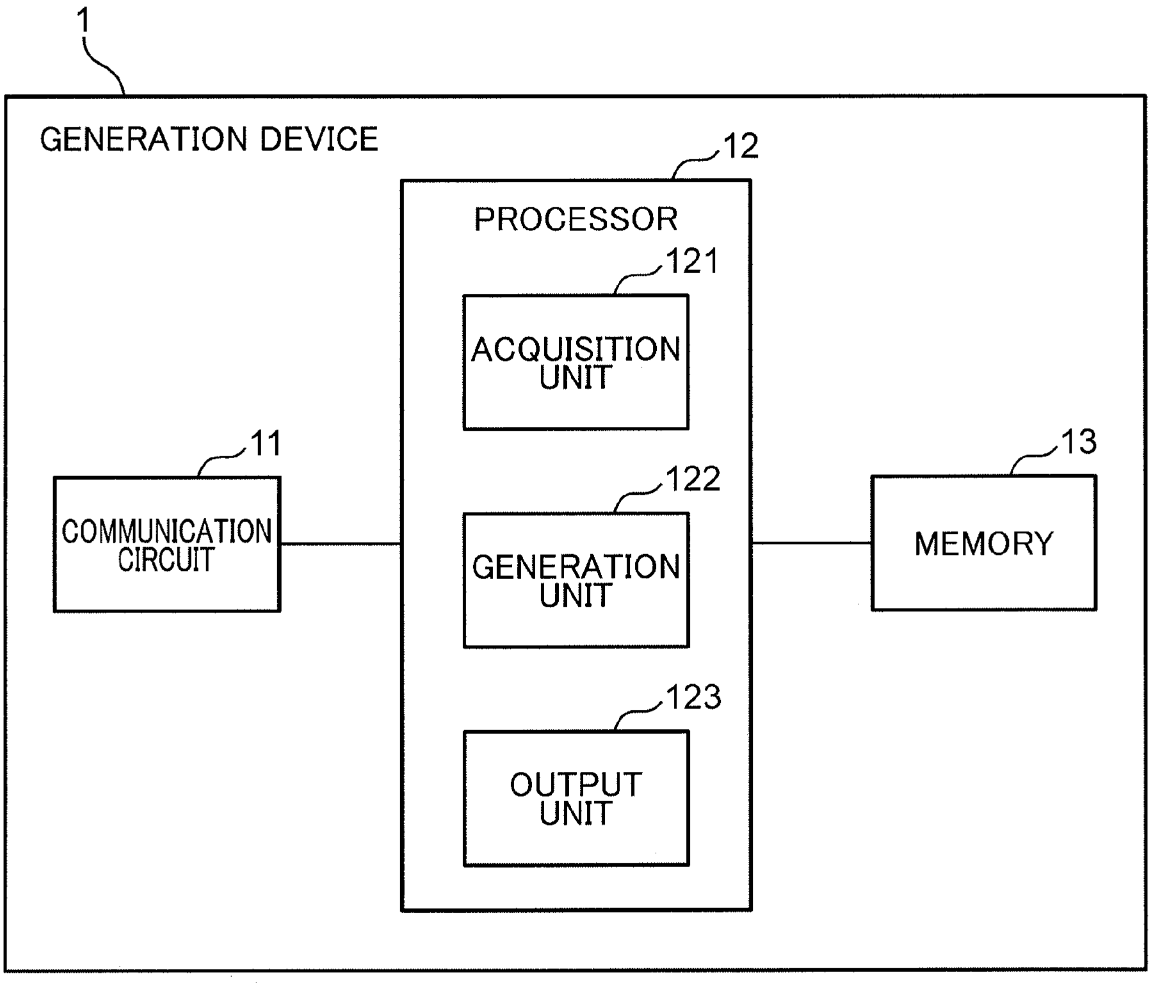
FIG. 2 is a block diagram illustrating an example of a configuration of a generation device in the first embodiment of the present disclosure.

FIG. 2 is a block diagram illustrating an example of the configuration of the generation device 1 in the first embodiment of the present disclosure. The generation device 1 includes a communication circuit 11, a processor 12, and a memory 13. The communication circuit 11 connects the generation device 1 to the network NT. The communication circuit 11 transmits a trained model to the imparting device 2. The communication circuit 11 receives operating data from the imparting device 2.

The processor 12 includes, for example, a central processing unit. The processor 12 includes an acquisition unit 121, a generation unit 122, and an output unit 123. The acquisition unit 121 acquires one or more pieces of identification information imparted to a component of a certain hierarchy among the plurality of components constituting the battery 3. Each piece of identification information is identifiably imparted with the type and the number of components in a lower hierarchy. In addition, the acquisition unit 121 acquires operating data corresponding to each piece of identification information from the imparting device 2.

Figure 5:
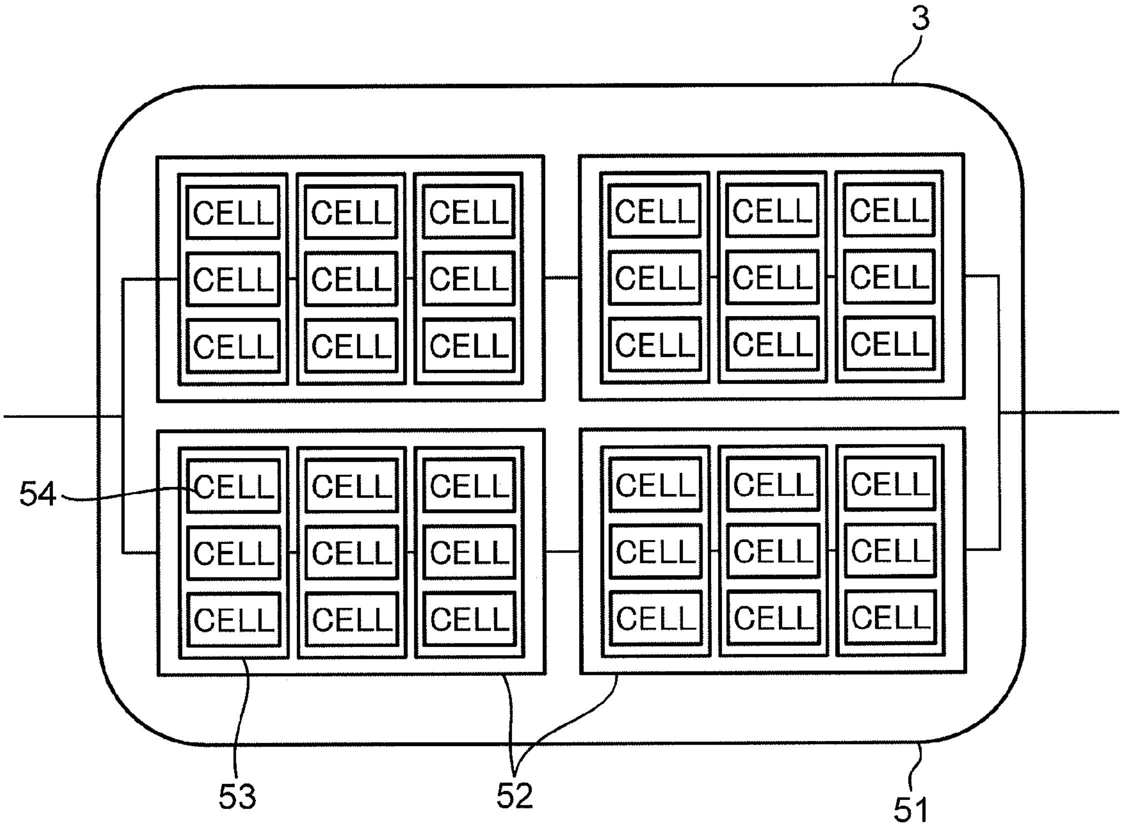
FIG. 5 is a view illustrating an example of a component of the battery.

FIG. 5 is a view illustrating an example of components of the battery 3. The battery 3 includes a plurality of components including a battery pack 51, a module 52, a block 53, and a cell 54. The block 53 includes a plurality of the cells 54 connected in parallel. The module 52 includes a plurality of the blocks 53 connected in series. The battery pack 51 includes a plurality of the modules 52 connected in series and in parallel. In the example of FIG. 5, the battery pack 51 includes four modules 52. The battery pack 51 is configured by connecting in parallel two module groups including two modules 52 connected in series. Note that the block 53 may include one cell 54. The module 52 may include one block 53. The battery pack 51 may include one module 52. In this manner, the battery 3 has the components of the battery pack 51, the module 52, the block 53, and the cell 54 that are hierarchically configured in this order.

The identification information of the battery 3 includes type identification information (hereinafter, referred to as "type ID") for identifying each component by type, and individual identification information (hereinafter, referred to as "individual ID") for identifying each component individually. The type ID includes a cell type ID, a block type ID, a module type ID, and a pack type ID. The cell type ID is identification information for identifying the cell 54 by type. The block type ID is identification information for identifying the block 53 by type. The module type ID is identification information for identifying the module 52 by type. The pack type ID is identification information for identifying the battery pack 51 by type.

The individual ID includes a cell individual ID, a block individual ID, a module individual ID, and a pack individual ID. The cell individual ID is identification information for identifying the cell 54 individually. The block individual ID is identification information for identifying the block 53 individually. The module individual ID is identification information for identifying the module 52 individually. The pack individual ID is identification information for identifying the battery pack 51 individually.

Referring back to FIG. 2. The generation unit 122 generates a trained model corresponding to each piece of identification information for estimating the state of the battery 3 by learning the operating data acquired by the acquisition unit 121 for each piece of identification information. The state of the battery to be estimated is, for example, a state of charge (SOC), a state of health (SOH), or a sign of failure. The sign of failure is, for example, a remaining life time.

The operating data includes, for example, at least one of the current, the voltage, and the temperature of the battery 3. Furthermore, the operating data includes the state of the battery 3. This state includes, for example, at least one of the SOC, the SOH, and the presence or absence of a sign of failure. Furthermore, the operating data includes a time stamp indicating a generation date and time of the operating data and the identification information of the battery 3. This identification information is, for example, a pack individual ID described later.

The output unit 123 outputs the trained model generated by the generation unit 122. For example, the output unit 123 transmits the generated trained model to the imparting device 2 using the communication circuit 11.

The memory 13 includes a nonvolatile rewritable storage device such as a solid state drive and a hard disk drive. The memory 13 stores the operating data acquired from the imparting device 2.

Figure 3:
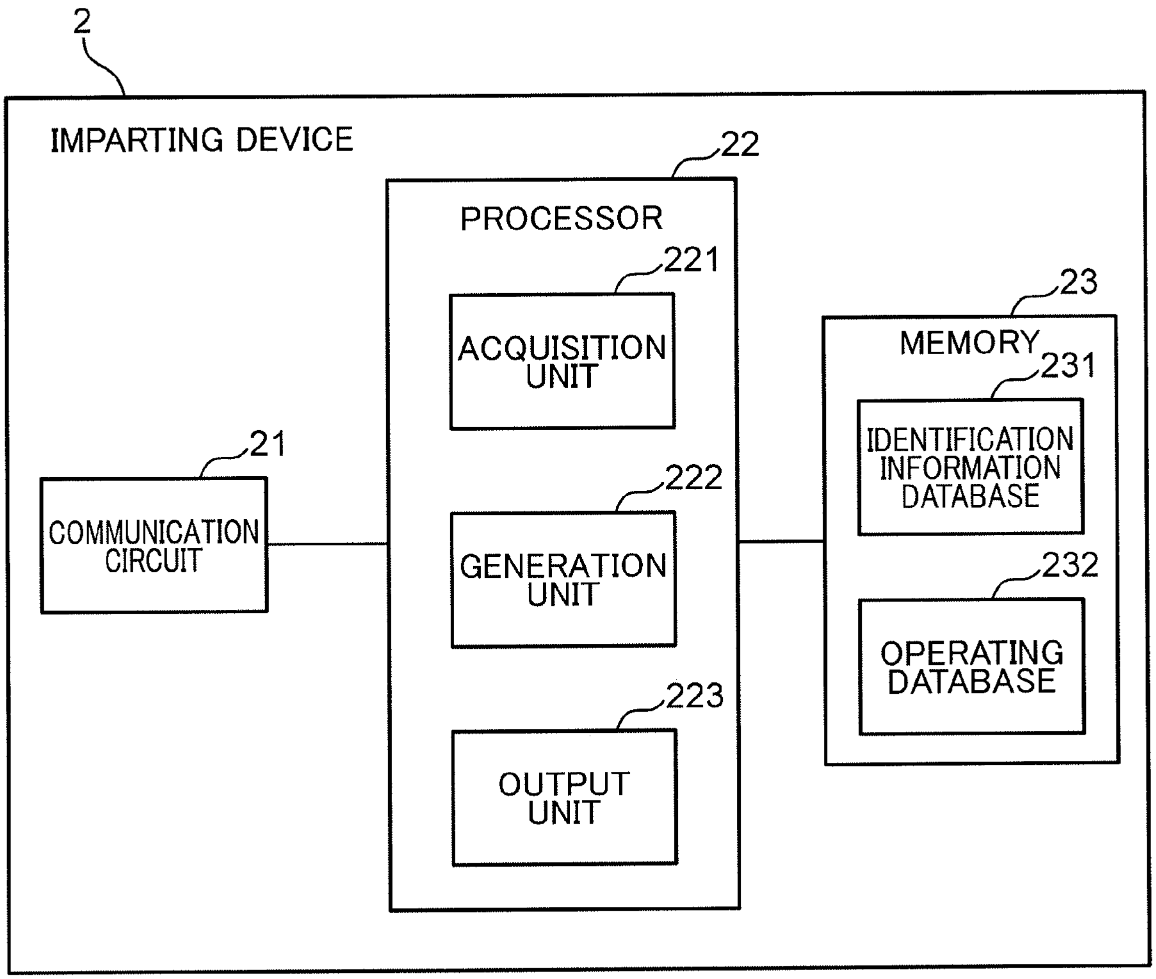
FIG. 3 is a block diagram illustrating an example of a configuration of an imparting device in the first embodiment of the present disclosure.

FIG. 3 is a block diagram illustrating an example of the configuration of the imparting device 2 in the first embodiment of the present disclosure. The imparting device 2 includes a communication circuit 21, a processor 22, and a memory 23. The communication circuit 21 connects the imparting device 2 to the network NT. The communication circuit 21 transmits operating data to the generation device 1 and transmits a trained model to the battery 3. The communication circuit 21 receives a trained model from the generation device 1 and receives operating data from the battery 3.

The processor 22 includes, for example, a central processing unit. The processor 22 includes an acquisition unit 221, a generation unit 222, and an output unit 223. Here, a certain component among the components of the battery 3 is referred to as first component. A component including the first component is referred to as second component. A component including the second component is referred to as third component.

The acquisition unit 221 acquires the first configuration information indicating the configuration corresponding to the type of the first component from the input terminal 4 using the communication circuit 21. The first configuration information includes, for example, characteristic data indicating the relationship between the remaining capacity of the first component and the voltage. Specifically, the characteristic data is data indicating the relationship between the SOC and an OCV.

The generation unit 222 generates a first type ID for identifying the first component by type based on the first configuration information acquired by the acquisition unit 221. In addition, the generation unit 222 stores the generated first type ID into an identification information database 231 in association with the first configuration information, thereby imparting the first type ID to the first component.

The acquisition unit 221 acquires the second configuration information indicating the configuration corresponding to the type of the second component from the input terminal 4 via the communication circuit 21. The second configuration information includes the first type ID and the number of first components constituting the second component.

The generation unit 222 generates a second type ID for identifying the second component by type based on the second configuration information acquired by the acquisition unit 221. In addition, the generation unit 222 stores the generated second type ID into the identification information database 231 in association with the second configuration information, thereby imparting the second type ID to the second component.

The acquisition unit 221 acquires the third configuration information indicating the configuration corresponding to the type of the third component from the input terminal 4 via the communication circuit 21. The third configuration information includes the second type ID, the number of second components, and connection information indicating the connection mode of the second components.

The generation unit 222 generates a third type ID for identifying the third component by type based on the third configuration information acquired by the acquisition unit 221. In addition, the generation unit 222 stores the generated third type ID into the identification information database 231 in association with the third configuration information, thereby imparting the third type ID to the third component.

The acquisition unit 221 acquires the fourth configuration information indicating the configuration corresponding to the individual of the third component from the input terminal 4 via the communication circuit 21. The fourth configuration information includes the third type ID and the manufacturing number of the third component.

The generation unit 222 generates a first individual ID (fourth identification information) for identifying the third component individually based on the fourth configuration information acquired by the acquisition unit 221. In addition, the generation unit 222 stores the generated first individual ID into the identification information database 231 in association with the fourth configuration information, thereby imparting the first individual ID to the third component.

The acquisition unit 221 acquires the fifth configuration information indicating the configuration corresponding to the individual of the second component from the input terminal 4 via the communication circuit 21. The fifth configuration information includes the fourth identification information and the manufacturing number of the second component.

The generation unit 222 generates a second individual ID (fifth identification information) for identifying the second component individually based on the fifth configuration information acquired by the acquisition unit 221. In addition, the generation unit 222 stores the generated second individual ID into the identification information database 231 in association with the fifth configuration information, thereby imparting the second individual ID to the second component.

The output unit 223 transmits the identification information (the first type ID to the third type ID and the first individual ID and the second individual ID) generated by the generation unit 222 to the input terminal 4 using the communication circuit 21.

The memory 23 includes a nonvolatile rewritable storage device such as a solid state drive or a hard disk drive. The memory 23 stores the identification information database 231 and an operating database 232.

The identification information database 231 is a database for managing identification information imparted to the battery 3. The identification information database 231 stores the identification information imparted to each component and the configuration information of the respective component in association with each other. Specifically, the identification information database 231 stores the first type ID and the first configuration information in association with each other, stores the second type ID and the second configuration information in association with each other, stores the third type ID and the third configuration information in association with each other, stores the first individual ID and the fourth configuration information in association with each other, and stores the second individual ID and the fifth configuration information in association with each other.

The operating database 232 stores operating data of each of the batteries 3. Specifically, the operating database 232 stores the pack type ID, time stamp, current, voltage, temperature, and state (SOC, SOH, sign of failure, and the like) in association with one another.

Figure 4:
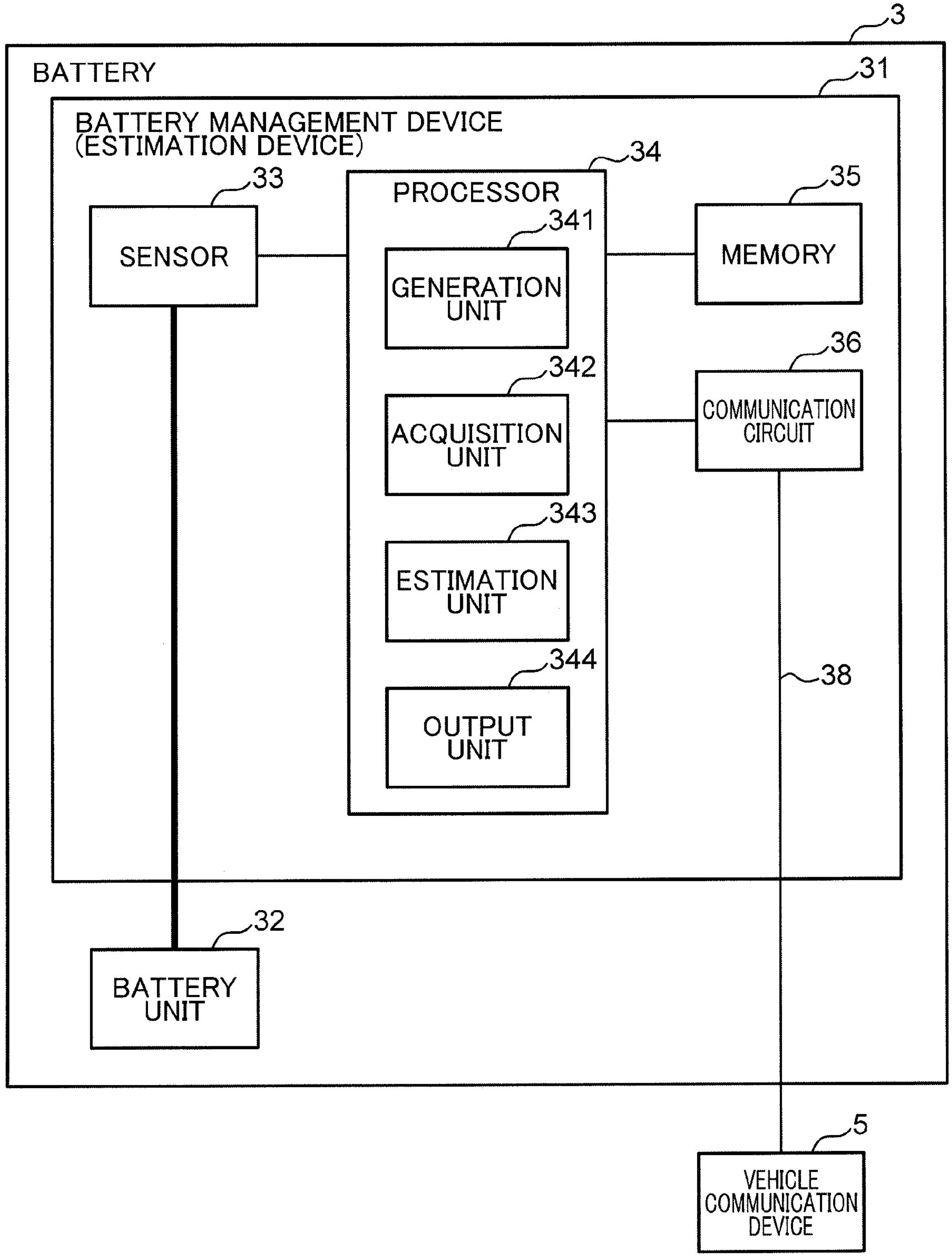
FIG. 4 is a block diagram illustrating an example of a configuration of a battery in the first embodiment of the present disclosure.

FIG. 4 is a block diagram illustrating an example of the configuration of the battery 3 in the first embodiment of the present disclosure. The battery 3 includes a battery management device 31 (an example of the estimation device) and a battery unit 32.

The battery management device 31 is a device that manages the battery 3, such as estimating the state (SOC, SOH, and sign of failure) of the battery 3. The battery management device 31 includes a sensor 33, a processor 34, a memory 35, and a communication circuit 36. The sensor 33 includes a current sensor, a voltage sensor, and a temperature sensor. The current sensor measures a current flowing through the battery 3. The voltage sensor measures the voltage of the battery 3. The temperature sensor detects the temperature of the battery 3.

The processor 34 is configured by, for example, a central processing unit, and includes a generation unit 341, an acquisition unit 342, an estimation unit 343, and an output unit 344. The generation unit 341 generates operating data of the battery at a predetermined sampling period. For example, the generation unit 341 may generate the operating data by acquiring the current, the voltage, and the temperature from the sensor 33 and acquiring, from the estimation unit 343, the state of the battery 3 estimated by the estimation unit 343.

The acquisition unit 342 acquires the operating data generated by the generation unit 341. In addition, the acquisition unit 342 acquires, via the vehicle communication device 5 and the communication circuit 36, the trained model transmitted from the imparting device 2, and stores the trained model into the memory 35. The acquisition unit 342 acquires, via the vehicle communication device 5 and the communication circuit 36, the pack individual ID described later having been imparted to the battery 3 by the imparting device 2, and stores the pack individual ID into the memory 35.

The estimation unit 343 inputs, into the trained model, the operating data acquired by the acquisition unit 342, and estimates the state of the battery. Here, the estimation unit 343 may input, into the trained model, information (e.g., current, voltage, and temperature) other than the state of the battery 3 in the operating data. In a case of not having a trained model, the estimation unit 343 may calculate the state of the battery 3 by inputting the current, the voltage, and the temperature to a predetermined calculation formula.

In order to transmit the operating data generated by the generation unit 341 to the imparting device 2 at a predetermined sampling period, the output unit 344 inputs the operating data into the communication circuit 36. Due to this, the operating data is transmitted to the imparting device 2 via the communication circuit 36 and the vehicle communication device 5, and the operating data is accumulated in the imparting device 2. In order to present the state information indicating the state of the battery 3 estimated by estimation unit 343 to a presentation device (not illustrated), the output unit 344 inputs the state information into communication circuit 36. The presentation device may be a display provided in a vehicle mounted with the battery 3, or may be a user terminal possessed by the user (driver) of the vehicle.

The memory 35 includes, for example, a rewritable semiconductor memory such as a flash memory, and stores a trained model. The memory 35 stores a BMS type ID, which is identification information imparted in advance to the battery management device 31. The memory 35 stores the pack individual ID imparted by the imparting device 2.

The communication circuit 36 is a communication circuit that connects the battery 3 to an in-vehicle network 38 such as a controller area network (CAN). The communication circuit 36 is connected to the vehicle communication device 5 via the in-vehicle network 38.

The battery unit 32 includes the battery pack 51 illustrated in FIG. 5.

The vehicle communication device 5 is a communication circuit included in the vehicle mounted with the battery 3. The vehicle communication device 5 connects the battery 3 to the network NT. For example, the vehicle communication device 5 may connect the battery 3 to the network NT by connecting to a user terminal possessed by the user of the vehicle through a wireless communication path such as BLE. Alternatively, the vehicle communication device 5 may be connected to the network NT not via the user terminal.

Figure 6:
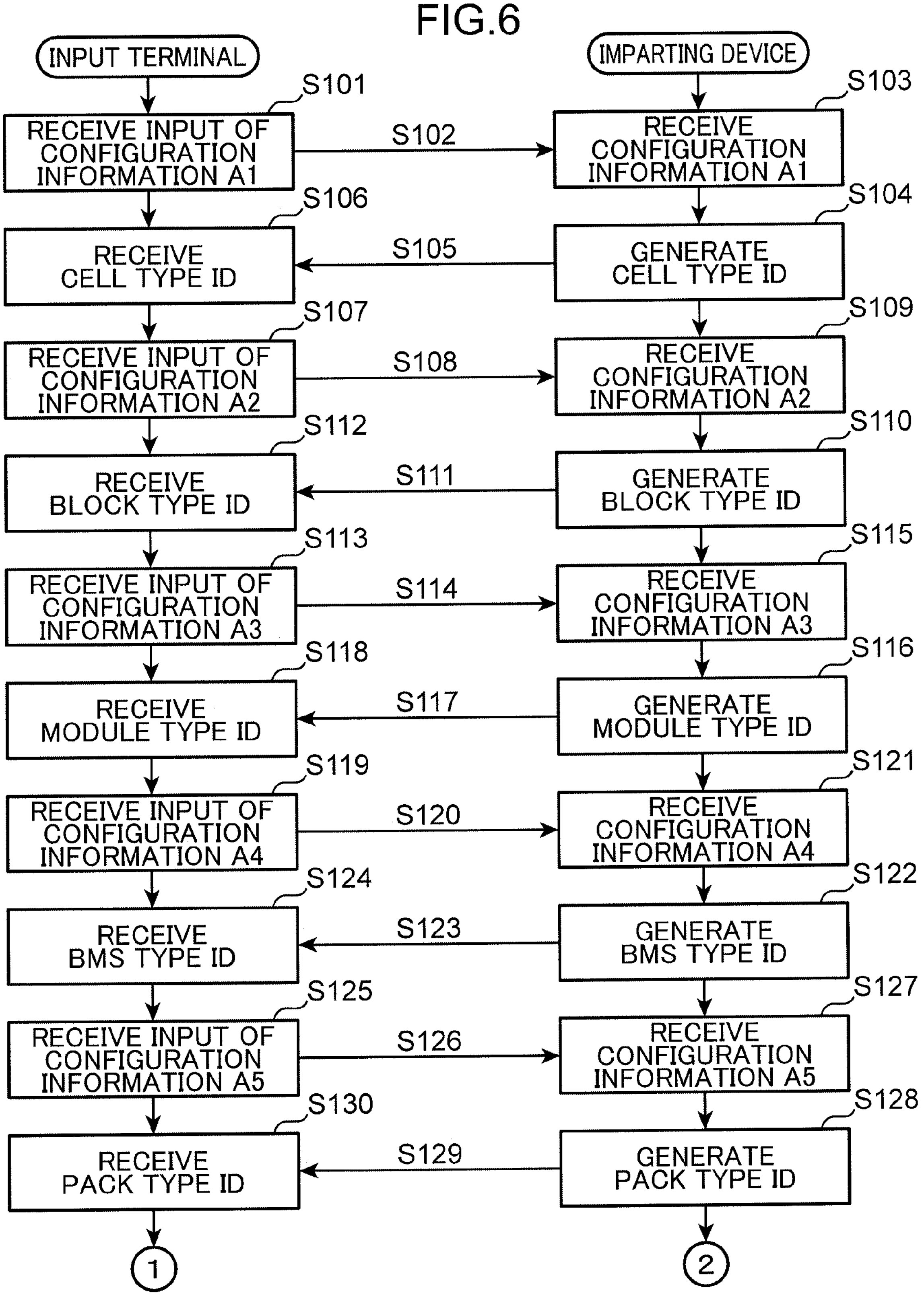
FIG. 6 is a flowchart illustrating an example of processing in which the imparting device generates identification information in the first embodiment of the present disclosure.

The above is the configuration of the information processing system. Next, the operation of the information processing system will be described. FIG. 6 is a flowchart illustrating an example of the processing in which the imparting device 2 generates identification information in the first embodiment of the present disclosure.

First, configuration information A1 to A5 and configuration information B1 to B4 used in this flowchart will be described.

The configuration information A1 is configuration information of the cell 54 by type. Specifically, the configuration information A1 includes characteristic data of the cell 54. Furthermore, the configuration information A1 may include manufacturer information of the cell 54, a model number of the cell 54, and a capacity of the cell 54. The configuration information A1 is an example of the first configuration information.

The configuration information A2 is configuration information of the block 53 by type. The configuration information A2 includes the cell type ID (first type ID) and the number of cells 54 constituting the block 53. Furthermore, the configuration information A2 may include manufacturer information and a model number of the block 53. The configuration information A2 is an example of the second configuration information.

The configuration information A3 is configuration information of the module 52 by type. The configuration information A3 includes the block type ID (second type ID) and the number of blocks 53 constituting the module 52. Furthermore, the configuration information A3 may include the number of probes, manufacturer information, and a model number of the block 53 constituting the module 52. The configuration information A3 is an example of the second configuration information. The number of probes is the number of probes of the temperature sensor attached to the block 53.

The configuration information A4 is configuration information of the battery management device 31 by type. The configuration information A4 includes manufacturer information, a model number, the number of sensors 33, type information of the sensors 33, and a BMS type ID of the battery management device 31. The configuration information A4 does not include configuration information of components in other hierarchies. The BMS type ID is identification information for identifying the battery management device 31 by type.

The configuration information A5 is configuration information of the battery pack 51 by type. The configuration information A5 includes a module type ID (second type ID), the number of modules 52 constituting the battery pack 51, and connection information. The connection information is information indicating the connection mode of the module 52. The connection information includes, for example, the number of series connections of the modules 52 and the number of parallel connections of the modules 52. Furthermore, the configuration information A5 may include manufacturer information, a model number, a rated capacity, a rated discharge output, a rated charge output, an initial pack rated FCC, an initial pack rated DC resistance, an operating time log measurement recording period, an operating time log update period, an idle time log update period, a trained model update confirmation period, battery pack attachment information, and a BMS type ID of the battery management device 31 of the battery pack 51. The configuration information A5 is an example of the third configuration information.

The configuration information B1 is configuration information indicating the configuration corresponding to the individual of the battery management device 31. The configuration information B1 includes a BMS type ID, a manufacturing lot number, a manufacturing number, and a manufacturing date and time of the battery management device 31.

The configuration information B2 is configuration information indicating the configuration corresponding to the individual of the battery pack 51. The configuration information B2 includes a pack type ID (third type ID) and a manufacturing number of the battery pack 51. The configuration information B2 may further include a BMS individual ID of the battery management device 31, a manufacturing lot number of the battery pack 51, a manufacturing date and time of the battery pack 51, an update confirmation period of the trained model, an initial pack actual measurement FCC of the battery pack 51, and an initial pack actual measurement DC resistance of the battery pack 51. The configuration information B2 is an example of the fourth configuration information.

The configuration information B3 is configuration information indicating the configuration corresponding to the individual of the module 52. The configuration information B3 includes a module type ID (second type ID) and a manufacturing number of the module 52. Furthermore, the configuration information B3 may include a pack individual ID (first individual ID) and a pack type ID (third type ID) of the battery pack 51, and a manufacturing lot number and a manufacturing date and time of the module 52. The configuration information B3 is an example of the fifth configuration information.

The configuration information B4 is configuration information indicating the configuration corresponding to the individual of the block 53. The configuration information B4 includes a block type ID (second type ID) and a manufacturing number of the block 53. Furthermore, the configuration information B4 may include a module individual ID (second individual ID), a module type ID, a manufacturing lot number, and a manufacturing date and time. The configuration information B4 is an example of the fifth configuration information.

In the light of the above, FIG. 6 will be described below. In step S101, the input terminal 4 receives input of the configuration information A1. Here, the user of the input terminal 4 may input the configuration information A1 with reference to the specification table of the battery 3 in accordance with an input form displayed on the input terminal 4. The same applies to the input of the following configuration information. This user is a user who manages the operation of the vehicle mounted with the battery 3, for example.

In step S102, the input terminal 4 transmits the configuration information A1 to the imparting device 2. In step S103, the imparting device 2 receives the configuration information A1.

In step S104, the imparting device 2 generates a cell type ID for identifying the cell 54 by type based on the configuration information A1. The cell type ID is stored in the identification information database 231 in association with the configuration information A1.

In step S105, the imparting device 2 transmits the cell type ID to the input terminal 4. When the cell type ID of the cell 54 of the corresponding type has been generated, the imparting device 2 may transmit the generated cell type ID to the input terminal 4. The same applies to the following type ID and individual ID.

In step S106, the input terminal 4 receives the cell type ID. In step S107, the input terminal 4 receives input of the configuration information A2. In step S108, the input terminal 4 transmits the configuration information A2 to the imparting device 2.

In step S109, the imparting device 2 receives the configuration information A2. In step S110, the imparting device 2 generates a block type ID for identifying the block 53 by type based on the configuration information A2. The block type ID is stored in the identification information database 231 in association with the configuration information A2.

In step S111, the imparting device 2 transmits the cell type ID to the input terminal 4. In step S112, the input terminal 4 receives the block type ID.

In step S113, the input terminal 4 receives input of the configuration information A3. In step S114, the input terminal 4 transmits the configuration information A3 to the imparting device 2. In step S115, the imparting device 2 receives the configuration information A3.

In step S116, the imparting device 2 generates a module type ID for identifying the module 52 by type based on the configuration information A3. In step S117, the imparting device 2 transmits the module type ID to the input terminal 4. In step S118, the input terminal 4 receives the module type ID.

In step S119, the input terminal 4 receives input of the configuration information A4. In step S120, the input terminal 4 transmits the configuration information A4 to the imparting device 2. In step S121, the imparting device 2 receives the configuration information A4.

In step S122, the imparting device 2 generates a BMS type ID for identifying the battery management device 31 by type based on the configuration information A4. In step S123, the imparting device 2 transmits the BMS type ID to the input terminal 4. In step S124, the input terminal 4 receives the BMS type ID.

In step S125, the input terminal 4 receives input of the configuration information A5. In step S126, the input terminal 4 transmits the configuration information A5 to the imparting device 2. In step S127, the imparting device 2 receives the configuration information A5.

In step S128, the imparting device 2 generates a pack type ID for identifying the battery pack 51 by type based on the configuration information A5. In step S129, the imparting device 2 transmits the pack type ID to the input terminal 4. In step S130, the input terminal 4 receives the pack type ID.

Figure 7:
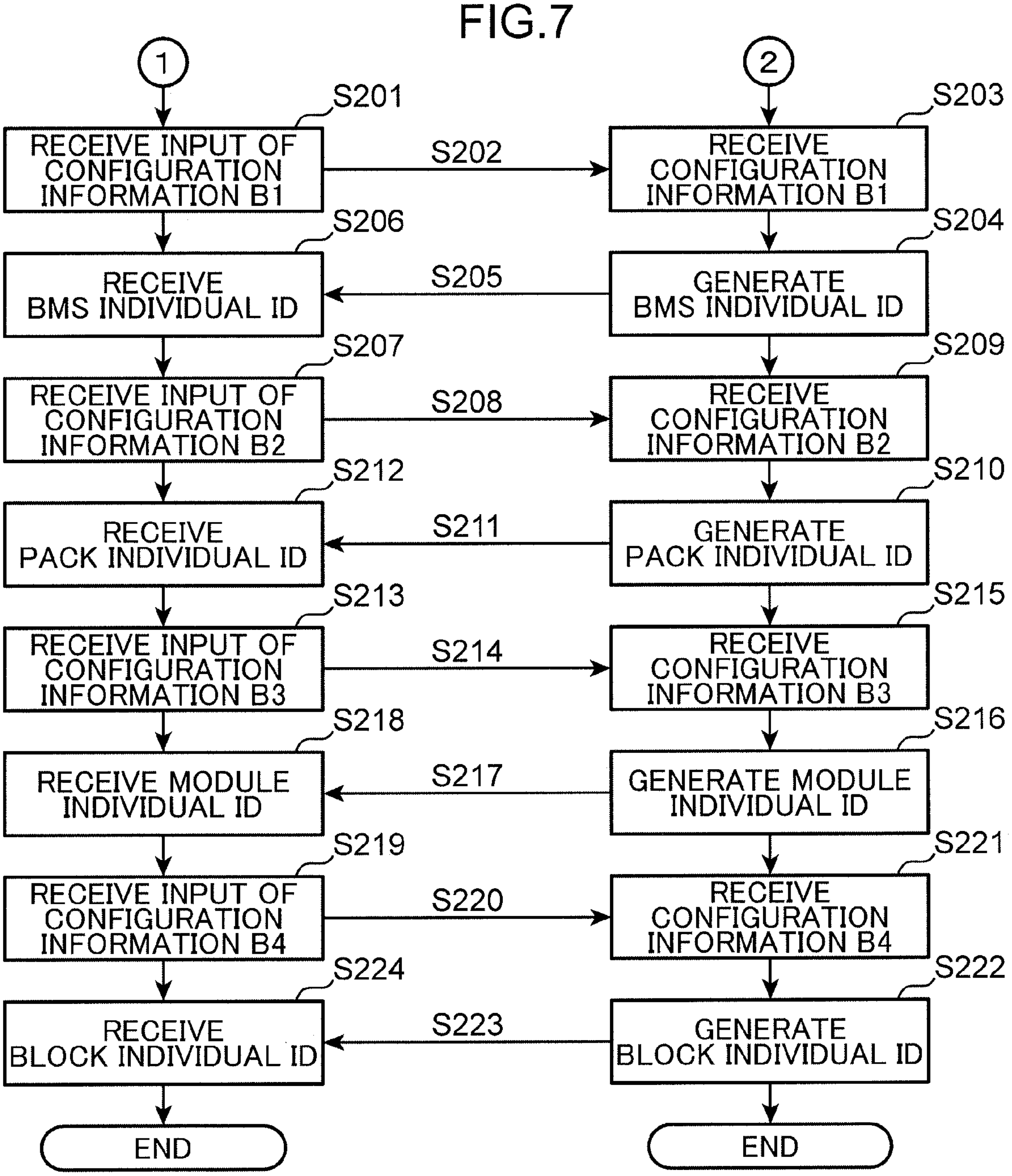
FIG. 7 is a flowchart following FIG. 6.

FIG. 7 is a flowchart following FIG. 6. In step S201, the input terminal 4 receives input of the configuration information B1. In step S202, the input terminal 4 transmits the configuration information B1 to the imparting device 2. In step S203, the imparting device 2 receives the configuration information B1.

In step S204, the imparting device 2 generates a BMS individual ID for identifying the battery management device 31 individually based on the configuration information B1. In step S205, the imparting device 2 transmits the BMS individual ID to the input terminal 4. In step S206, the input terminal 4 receives the BMS individual ID.

In step S207, the input terminal 4 receives input of the configuration information B2. In step S208, the input terminal 4 transmits the configuration information B2 to the imparting device 2. In step S209, the imparting device 2 receives the configuration information B2.

In step S210, the imparting device 2 generates a pack individual ID for identifying the battery pack 51 individually based on the configuration information B2. In step S211, the imparting device 2 transmits the pack individual ID to the input terminal 4. In step S212, the input terminal 4 receives the pack individual ID.

In step S213, the input terminal 4 receives input of the configuration information B3. In step S214, the input terminal 4 transmits the configuration information B3 to the imparting device 2. In step S215, the imparting device 2 receives the configuration information B3.

In step S216, the imparting device 2 generates a module individual ID for identifying the module 52 individually based on the configuration information B3. In step S217, the imparting device 2 transmits the module individual ID to the input terminal 4. In step S218, the input terminal 4 receives the module individual ID.

In step S219, the input terminal 4 receives input of the configuration information B4. In step S220, the input terminal 4 transmits the configuration information B4 to the imparting device 2. In step S221, the imparting device 2 receives the configuration information B4.

In step S222, the imparting device 2 generates a block individual ID for identifying the block 53 individually based on the configuration information B4. In step S223, the imparting device 2 transmits the block individual ID to the input terminal 4. In step S224, the input terminal 4 receives the block individual ID.

In this manner, the type ID is generated in order from the lower component, and the individual ID is generated in order from the higher component.

Figure 8:
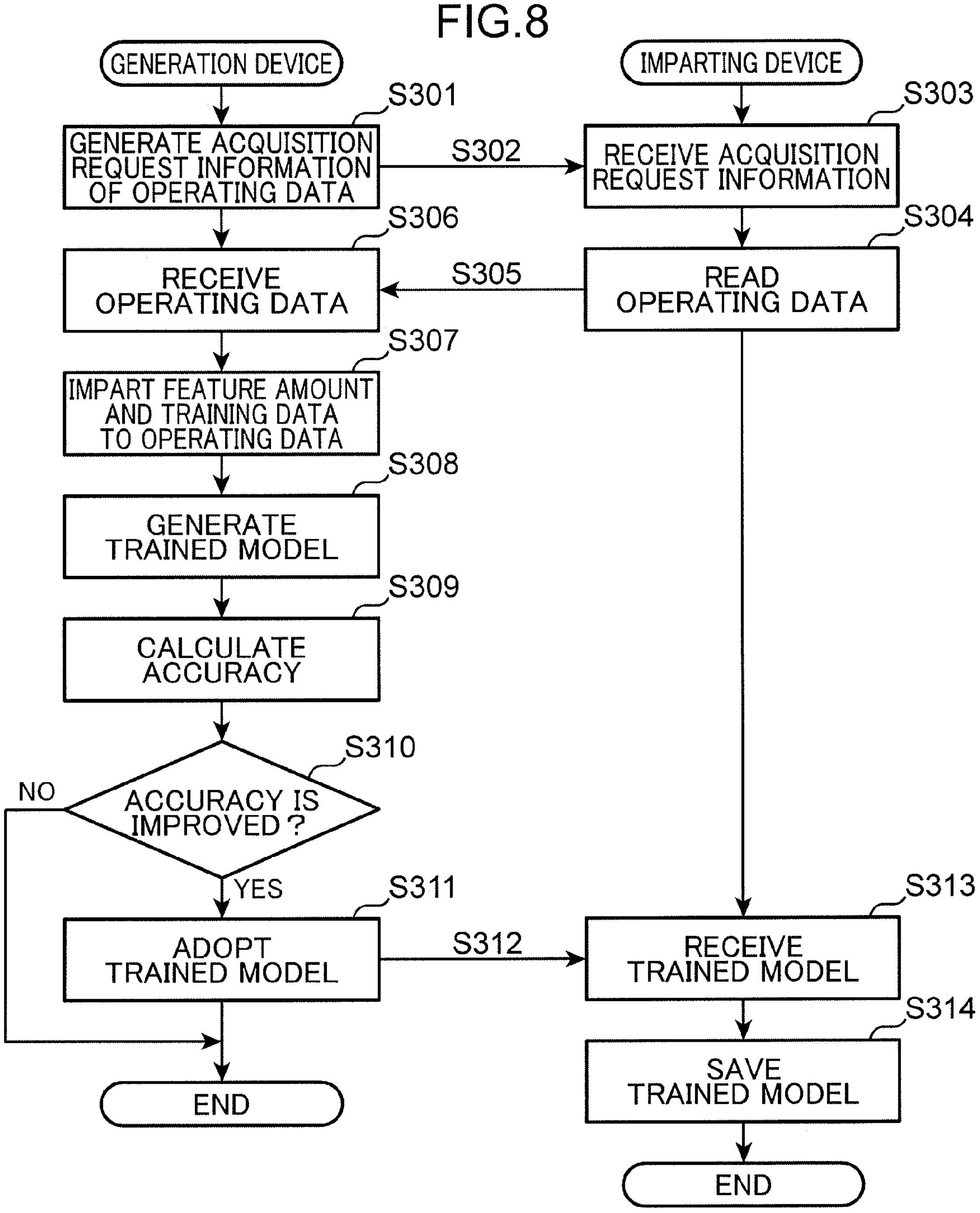
FIG. 8 is a flowchart illustrating an example of processing in which the generation device generates a trained model in the first embodiment of the present disclosure.

Next, generation of the trained model will be described. FIG. 8 is a flowchart illustrating an example of the processing in which the generation device 1 generates a trained model in the first embodiment of the present disclosure. In step S301, the generation device 1 generates acquisition request information of operating data. The acquisition request information includes information (hierarchy designation information) designating a hierarchy of the identification information and information (period designation information) designating a range of a time stamp of the operating data. The hierarchy of identification information corresponds to the cell type ID, the block type ID, the module type ID, the pack type ID, the pack individual ID, the module individual ID, and the block individual ID. The hierarchy designation information is information for designating any hierarchy from among these hierarchies. The hierarchy of identification information is assumed to be the cell type ID, the block type ID, the module type ID, the pack type ID, the pack individual ID, the module individual ID, and the block individual ID in order from the top. This order is determined dependent on a large amount of operating data that can be collected. However, this is merely a prediction, and the data amount of the operating data does not necessarily increase actually in this order.

In step S302, the generation device 1 transmits acquisition request information to the imparting device 2. In step S303, the imparting device 2 receives the acquisition request information.

In step S304, the imparting device 2 reads, from the operating database 232, operating data corresponding to the hierarchy indicated by the hierarchy designation information and the period indicated by the period designation information included in the acquisition request information. For example, when the hierarchy of the pack type ID is designated, the imparting device 2 reads the operating data corresponding to the hierarchy from the operating database 232 for each pack type ID. "Read operating data for each pack type ID" means that, for example, when there are M pack type IDs, a data group of M operating data is read in association with the pack type ID.

In step S305, the imparting device 2 transmits the operating data to the generation device 1. In step S306, the generation device 1 receives the operating data.

In step S307, the generation device 1 imparts a feature amount and training data to the operating data. The feature amount corresponds to, for example, the current, the voltage, and the temperature. The training data corresponds to, for example, the state of the battery 3.

In step S308, the generation device 1 generates a trained model by causing the operating data to be learned for each piece of identification information. For example, when the operating data received in step S306 includes M data groups, M trained models are generated by causing the M data groups to be individually learned.

In step S309, the generation device 1 calculates the accuracy of the trained model. Here, the accuracy has a value that decreases as the training error increases. The training error is an error in the estimation value of the trained model with respect to the true value, and for example, a root mean square error (RMSE) or a mean square error (MSE) is adopted. When M trained models are generated, an average value of the accuracy of the M trained models is calculated.

In step S310, the generation device 1 determines whether or not the accuracy is improved from the accuracy of the trained model generated last time.

When the accuracy is improved (YES in step S310), the generation device 1 determines to adopt the trained model generated this time as the learning target (step S311). On the other hand, when the accuracy is lower than the accuracy of the trained model generated last time (NO in step S310), the generation device 1 ends the processing. In this case, the trained model generated last time is adopted as the learning target. The trained model generated last time is a trained model generated using operating data having a different hierarchy of identification information, for example, from the trained model generated this time.

In step S312, the generation device 1 transmits the trained model generated this time to the imparting device 2. In step S313, the imparting device 2 receives the trained model. In step S314, the imparting device 2 saves the trained model in a predetermined saving location of the memory 13. As described above, the trained model of the hierarchy with a higher accuracy is saved in the imparting device.

Figure 9:
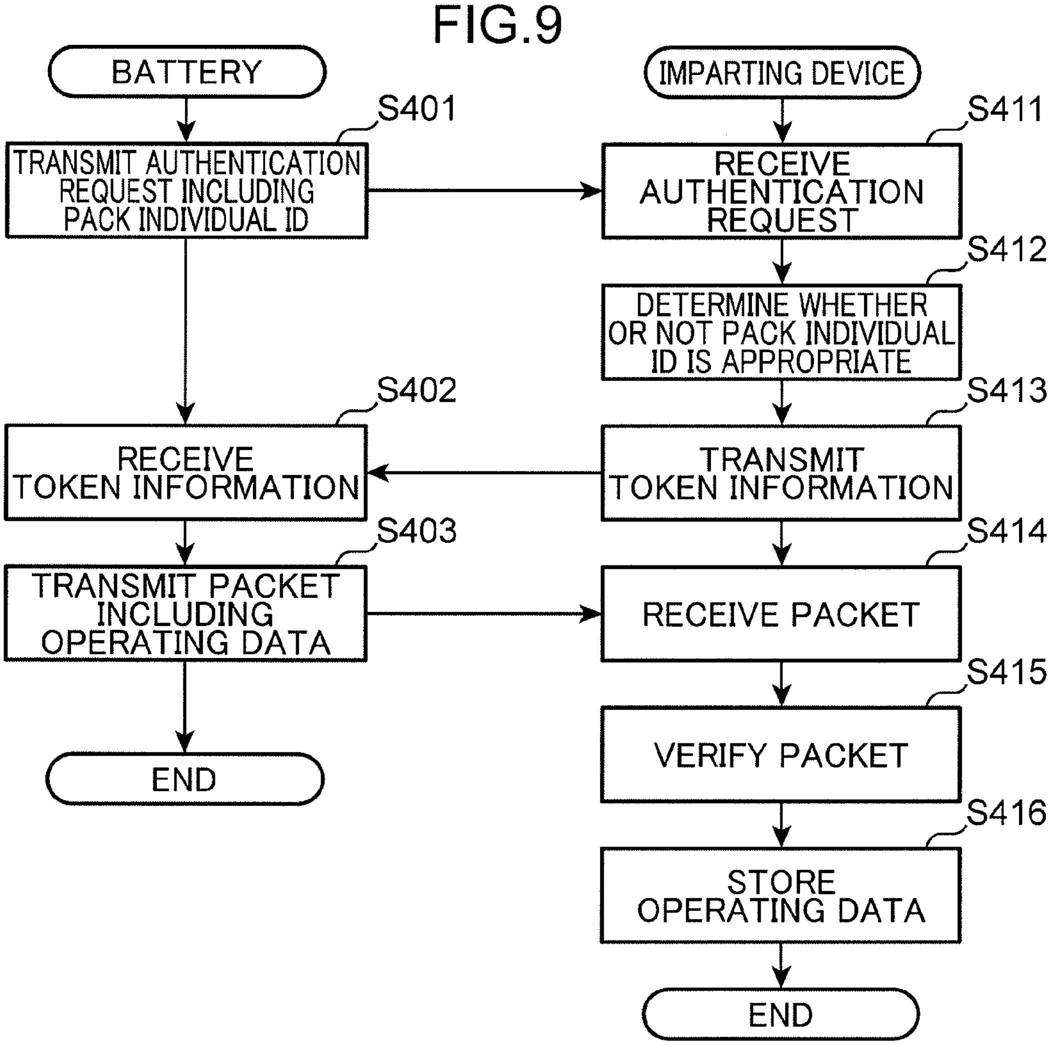
FIG. 9 is a view illustrating an example of processing when the battery uploads operating data in the first embodiment of the present disclosure.

FIG. 9 is a view illustrating an example of the processing when the battery 3 uploads operating data in the first embodiment of the present disclosure. In step S401, the battery 3 reads the pack individual ID from the memory 35, and transmits an authentication request including the pack individual ID to the imparting device 2.

In step S411, the imparting device 2 receives the authentication request. In step S412, the imparting device 2 determines whether or not the pack individual ID is appropriate. Here, when the pack individual ID is registered in the identification information database 231, the imparting device 2 determines that the pack individual ID is appropriate. On the other hand, if the pack individual ID is not registered in the identification information database 231, the imparting device 2 may determine that the pack individual ID is not appropriate, and may transmit, to the battery 3, a response indicating that the authentication has failed.

In step S413, token information is generated and transmitted to the battery 3. The token information is information generated when the authentication succeeds, and is information required when the battery 3 communicates with the imparting device 2.

In step S402, the battery 3 receives the token information. In step S403, the battery 3 generates operating data, generates a packet including the operating data and the token information, and transmits the generated packet to the imparting device 2.

In step S414, the imparting device 2 receives the packet. In step S415, the imparting device 2 verifies the packet. For example, when the received packet does not include the token information, the imparting device 2 discards the received packet. Alternatively, when the received packet does not include the pack individual ID, the imparting device 2 determines as a format error, and discards the received packet.

In step S416, the operating data included in the packet determined to be appropriate by the verification is stored in the operating database 232. Thereafter, the battery 3 generates operating data at a predetermined sampling rate, and transmits a packet including the operating data, the token information, and the pack individual ID to the imparting device 2.

Figure 10:
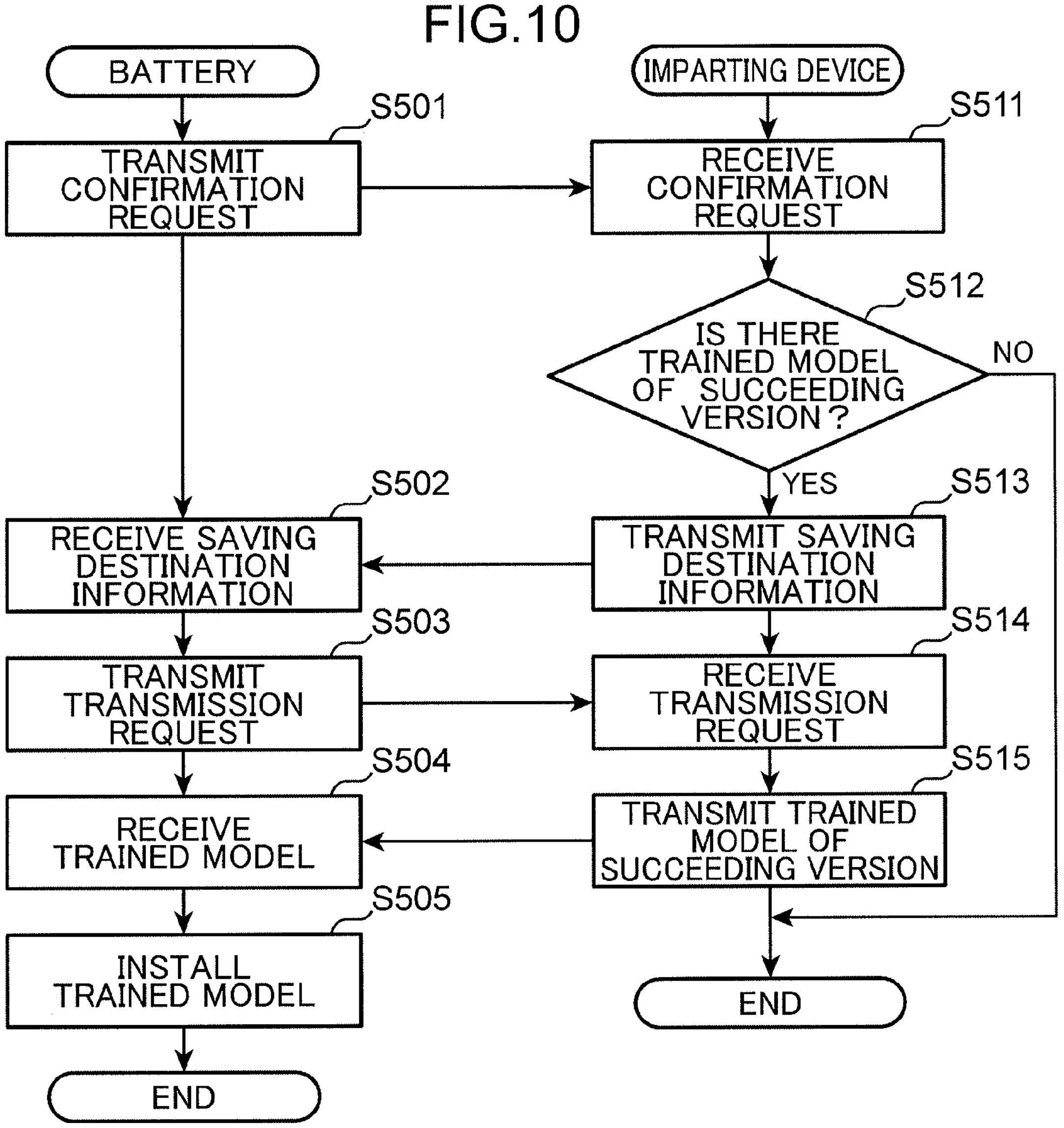
FIG. 10 is a flowchart illustrating an example of processing when the imparting device downloads a trained model to the battery in the first embodiment of the present disclosure.

FIG. 10 is a flowchart illustrating an example of the processing when the imparting device 2 downloads a trained model to the battery 3 in the first embodiment of the present disclosure. In step S501, the battery 3 transmits a confirmation request to the imparting device 2. The confirmation request includes the pack individual ID of the battery 3 itself, the version information of the trained model currently installed in the battery 3, and the name of the trained model. The name of the trained model corresponds to, for example, the type ID or the individual ID corresponding to the operating data that the trained model used for learning. Note that the confirmation request is regularly transmitted in accordance with the update confirmation period of the trained model included in the configuration information A5.

In step S511, the imparting device 2 receives the confirmation request. In step S512, the presence or absence of the trained model of the succeeding version is confirmed. For example, when the version information included in the confirmation request is not the latest version information corresponding to the name of the trained model, the imparting device 2 determines that there is a trained model of the succeeding version. On the other hand, when the version information included in the confirmation request is the latest version information corresponding to the name of the trained model, the imparting device 2 determines that there is not a trained model of the succeeding version.

When determining that there is a trained model of a succeeding version (YES in step S512), the imparting device 2 transmits, to the battery 3, saving destination information indicating a saving destination of the trained model of the succeeding version (step S513). For example, a uniform resource locator (URL) can be adopted as the saving destination information. On the other hand, when it is determined that there is no trained model of the succeeding version (NO in step S512), the process ends.

In step S502, the battery 3 receives the saving destination information. In step S503, the battery 3 transmits a transmission request of the trained model with the saving destination indicated by the saving destination information as the transmission destination. In step S514, the imparting device 2 receives the transmission request. In step S515, the imparting device 2 transmits the trained model of the succeeding version to the battery 3.

In step S504, the battery 3 receives the trained model. In step S505, the battery 3 installs the trained model. As described above, the latest trained model is installed in the battery 3.

Figure 11:
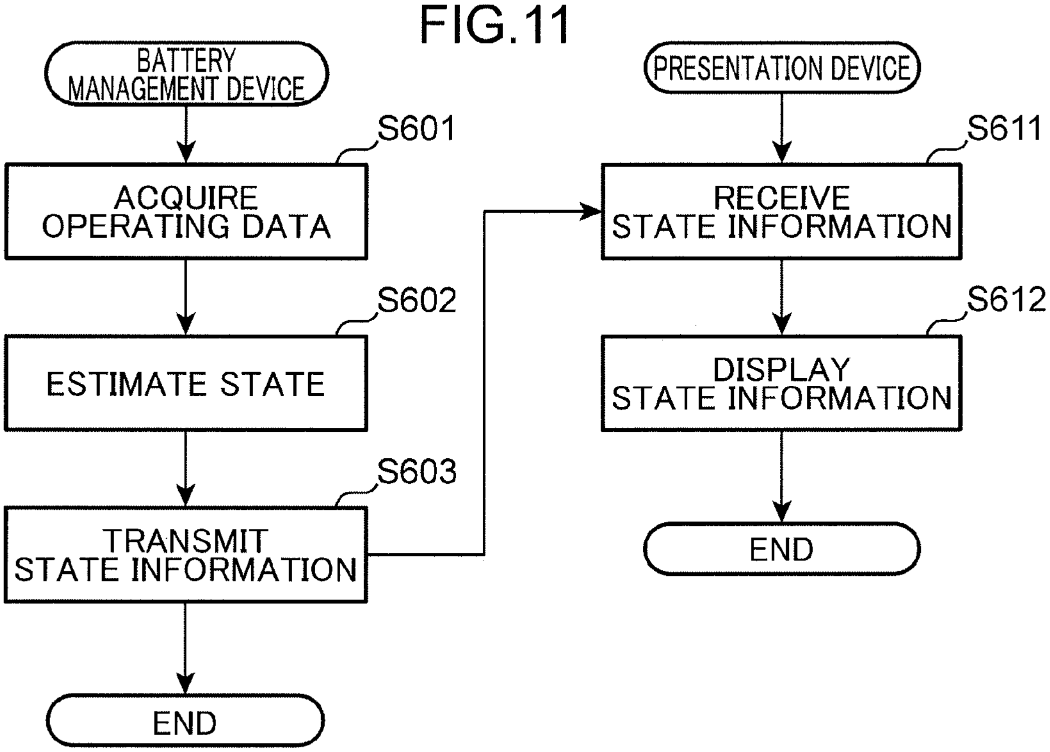
FIG. 11 is a flowchart illustrating an example of processing of a utilization phase of a trained model in the first embodiment of the present disclosure.

Next, the utilization phase of the trained model will be described. FIG. 11 is a flowchart illustrating an example of the processing of the utilization phase of a trained model in the first embodiment of the present disclosure. In step S601, the acquisition unit 342 of the battery management device 31 acquires the operating data generated by the generation unit 341. In step S602, the estimation unit 343 of the battery management device 31 estimates the state of the battery 3 by inputting the operating data into the trained model. For example, a feature amount (current, voltage, and temperature) constituting the operating data is input to the trained model.

In step S603, the output unit 344 of the battery management device 31 transmits state information indicating the estimated state to the presentation device. In step S611, the presentation device receives the state information. In step S612, the presentation device displays the state information.

Due to this, the state (e.g., SOC, SOH, or sign of failure) of the battery 3 is presented to the user.

As described above, according to the information processing system of the first embodiment, the type ID is identifiably imparted with the type and the number of components in a lower hierarchy. Therefore, it is possible to acquire operating data of the same type and number as the components of the lower hierarchy. This can generate the trained model using the operating data of the batteries 3 in which the type and number of the components in a lower hierarchy are the same, and can generate the trained model in consideration of differences in the type and number of the components constituting the batteries 3. As a result, it is possible to generate a trained model capable of highly accurately estimating the state of the battery 3.

Since the state of the battery is estimated using such a trained model, the state of the battery can be highly accurately estimated.

Furthermore, since the second identification information for identifying the second component by type is generated based on the second configuration information including the first identification information and the number of the first components, it is possible to easily acquire the operating data of the batteries 3 having the same type and number of the first components, which are lower components.

Second Embodiment

Figure 12:
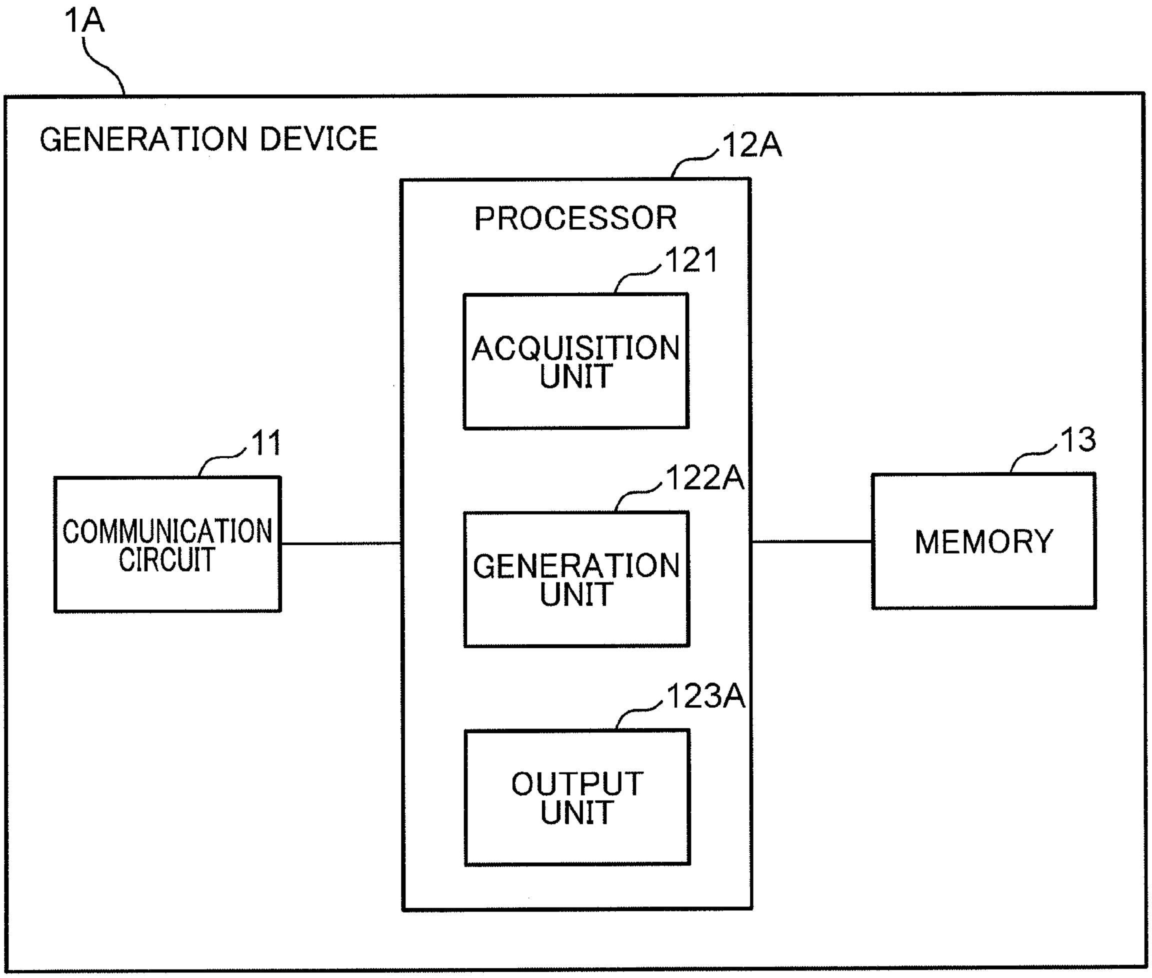
FIG. 12 is a block diagram illustrating an example of a configuration of a generation device in second embodiment of the present disclosure.

The second embodiment is to search for a hierarchy of identification information with a small training cost or a small training error of a trained model. In the second embodiment, the same components as those in the first embodiment are denoted by the same reference signs, and the description thereof will be omitted. FIG. 12 is a block diagram illustrating an example of the configuration of a generation device 1A in the second embodiment of the present disclosure.

For example, when a trained model is generated for each pack type ID, the number of trained models becomes enormous because as many trained models as the number corresponding to the type of the battery pack 51 are generated. As a result, the resource of the generation device 1A is taken up, and the training cost will increase.

Therefore, in the second embodiment, a hierarchy of identification information with a small training cost is searched. As described above, the hierarchy of identification information corresponds to the cell type ID, the block type ID, the module type ID, the pack type ID, the pack individual ID, the module individual ID, and the block individual ID, and this order is assumed to be a descending order of the hierarchy.

As the hierarchy of the identification information becomes higher, there is an advantage that the target range of the operating data increases and the data amount of the operating data used as the learning data increases. In addition, as the hierarchy of the identification information becomes higher, there is also an advantage that the number of generated trained models is reduced, and the burden on the resource is reduced. On the other hand, as the hierarchy of the identification information becomes higher, there is a disadvantage that the dedication is reduced, the features of the individual batteries 3 are hardly reflected, and the accuracy of the trained model is lowered.

As the hierarchy of the identification information becomes lower, the dedication increases, a trained model in which the features of the individual batteries 3 are more reflected can be generated, and if the data amount of the operating data used for learning is sufficient, there is an advantage that a highly accurate trained model can be generated.

On the other hand, as the hierarchy of the identification information becomes lower, there is a disadvantage that the target range of the operating data becomes narrower, and the data amount of the operating data used for learning becomes smaller. In addition, there is also a disadvantage that the number of trained models that becomes a learning target increases and the resource burden increases. Hereinafter, the configuration of the second embodiment will be specifically described. The following description does not assume the hierarchy of the first component, the second component, and the third component, which are components of the battery 3. In addition, identification information for identifying the first component is called first identification information, identification information for identifying the second component is called second identification information, and identification information for identifying the third component is called third identification information.

A processor 12A of the generation device 1A includes the acquisition unit 121, a generation unit 122A, and an output unit 123A. The generation unit 122A generates a first trained model corresponding to each piece of first identification information based on the operating data corresponding to each piece of the first identification information. The generation unit 122A calculates a training cost or a training error of the calculated first trained model. As the training cost or the training error of the first trained model, for example, an average value of the training costs or an average value of the training errors of the first trained models is adopted.

When the training cost or the training error of the first trained model is larger than a threshold, the generation unit 122A generates a second trained model corresponding to each piece of second identification information based on the operating data corresponding to each piece of the second identification information.

When the accuracy of the second trained model is higher than a reference accuracy, the generation unit 122A determines the second trained model as the trained model of a learning target. As the accuracy of the second trained model, an average value of the accuracy of each of the second trained models is adopted.

On the other hand, when the training cost or the training error of the first trained model is equal to or less than the threshold, the generation unit 122A determines the first trained model as the trained model of the learning target.

When the accuracy of the second trained model is lower than the reference accuracy, the generation unit 122A generates a third trained model corresponding to each piece of third identification information based on the operating data corresponding to each piece of the third identification information.

The training cost is calculated based on at least any one of the number of generated trained models, the data amount of operating data used for generation of the trained model, and the processing load of the processor 12A at the time of generating the trained model. For example, the training cost is calculated by the following formula.

$$\text{Training cost}=A1\cdot\text{Number of models}+A2\cdot\text{Data amount}+A3\cdot\text{Processing load}$$

As the processing load, for example, an accumulated time during which the load factor of the processor exceeds a reference load factor is adopted.

Figure 13:
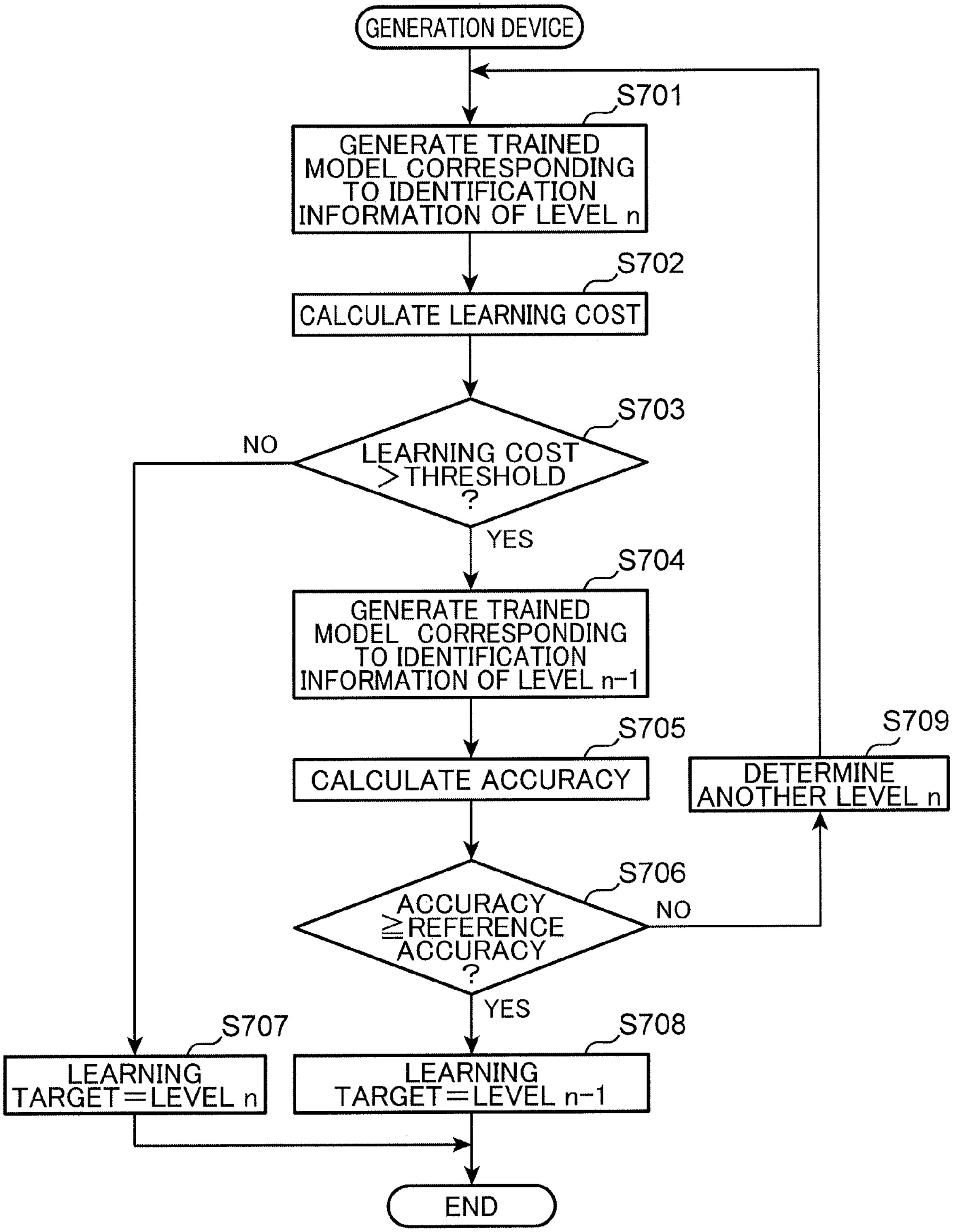
FIG. 13 is a flowchart illustrating a first example of processing of the generation device in the second embodiment of the present disclosure.

FIG. 13 is a flowchart illustrating the first example of the processing of the generation device in the second embodiment of the present disclosure. Note that this flowchart is executed regularly, for example. In the first example, the training cost is evaluated to determine the hierarchy of the identification information. In this flowchart, the SOC is adopted as the state of the battery 3 estimated by the trained model.

In step S701, the generation unit 122A generates a trained model M(n) corresponding to the identification information of a hierarchy n. For example, the default hierarchy n is a hierarchy of the pack type ID. Specifically, the generation unit 122A acquires, from the operating database 232, the operating data corresponding to each piece of identification information belonging to the hierarchy n, and learns the acquired operating data for each piece of identification information, thereby generating the trained model M(n) corresponding to each piece of identification information.

In step S702, the generation unit 122A calculates the training cost of the trained model M(n). In step S703, the generation unit 122A determines whether or not the training cost of the trained model M(n) is larger than a threshold. Here, the generation unit 122A may compare the average value of the training costs of the respective trained models M(n) with the threshold.

When the training cost is larger than the threshold (YES in step S703), the generation unit 122A generates a trained model M(n−1) corresponding to the identification information of a hierarchy n−1, which is one level higher than the hierarchy n (step S704). For example, in step S701, when the trained model M(n) corresponding to the pack type ID is generated, the trained model M(n−1) corresponding to the module type ID one hierarchy higher than the pack type ID is generated. Specifically, the generation unit 122A acquires, from the operating database 232, the operating data corresponding to each piece of identification information belonging to the hierarchy n−1, and learns the acquired operating data for each piece of identification information, thereby generating the trained model M(n−1) of the hierarchy n−1 corresponding to each piece of identification information. Here, a hierarchy one level higher is selected, but a hierarchy two or more levels higher may be selected. For example, the hierarchy of the highest cell type ID may be selected.

In step S705, the generation unit 122A calculates the accuracy of the trained model M(n−1). In step S706, the generation unit 122A determines whether or not the accuracy is equal to or more than the reference accuracy. Here, the generation unit 122A may compare the average value of the accuracy of each trained model M(n−1) with the reference accuracy. The larger the training error becomes, the smaller value the accuracy has. As the training error, for example, a root mean square error (RMSE) or a mean square error (MSE) is adopted.

When the accuracy is equal to or larger than the reference accuracy (YES in step S706), the generation unit 122A determines the hierarchy n−1 as a learning target (step S708). This thereafter generates and updates the trained model using the operating data corresponding to the identification information of the hierarchy n−1.

In step S703, when the training cost is equal to or less than the threshold (NO in step S703), the generation unit 122A determines the hierarchy n as a learning target (step S707). This thereafter generates and updates the trained model using the operating data corresponding to the identification information of the hierarchy n.

In step S706, when the accuracy is less than the reference accuracy (NO in step S706), the generation unit 122A determines another hierarchy n, and returns the process to step S701. As another hierarchy n, a hierarchy one level higher than the hierarchy n−1 determined in step S704 is determined. Note that when an appropriate trained model cannot be obtained even when the highest hierarchy is reached, the generation unit 122A may determine the lowest hierarchy in step S709.

In this manner, according to the first example, when the training cost of the trained model is larger than the threshold, the trained model of a higher hierarchy is generated, and when the training cost of the trained model is equal to or less than the threshold and the accuracy is equal to or more than the reference accuracy, the higher hierarchy is determined as the learning target. Therefore, it is possible to search for the hierarchy in which the training cost of the trained model is the smaller than the threshold and the trained model having an accuracy equal to or higher than the reference accuracy is obtained. Note that the first example adopts an algorithm for raising the hierarchy so that the training cost becomes equal to or less than the threshold, and therefore it is suitable for searching for the hierarchy of the trained model for estimating the SOC.

Figure 14:
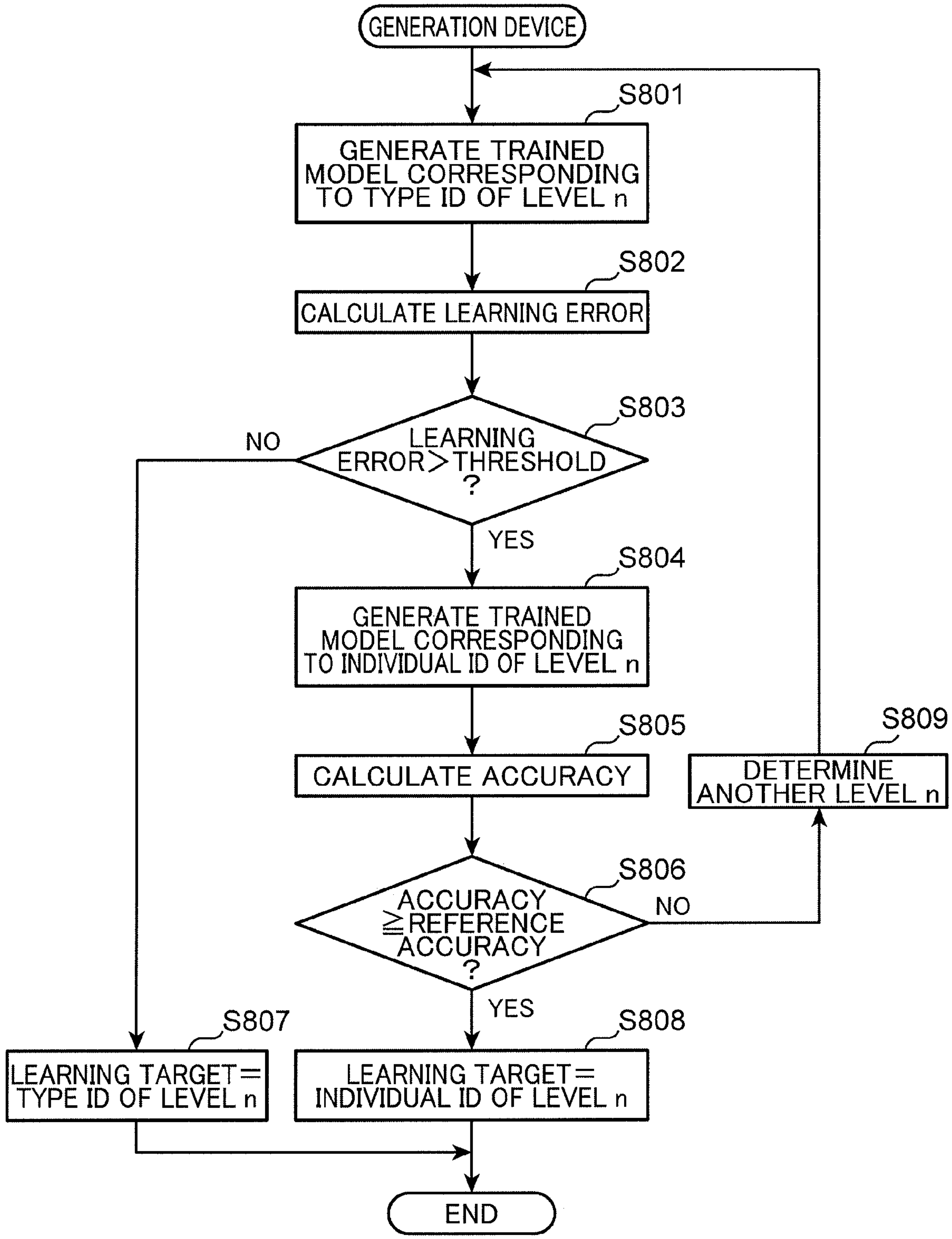
FIG. 14 is a flowchart illustrating a second example of processing of the generation device in the second embodiment of the present disclosure.

FIG. 14 is a flowchart illustrating the second example of the processing of the generation device in the second embodiment of the present disclosure. In the second example, the training error is evaluated to determine the hierarchy of the identification information. In this flowchart, the SOH is adopted as the state of the battery 3 estimated by the trained model.

In the second example, the hierarchy of the identification information corresponds to the block type ID, the module type ID, and the pack type ID, and this order is assumed to be a descending order. The hierarchies of the pack individual ID, the module individual ID, and the block individual ID are the same as the hierarchies of the pack type ID, the module type ID, and the block type ID, respectively. Furthermore, it is assumed that the type ID is higher in order than the individual ID in the same hierarchy.

In step S801, the generation unit 122A generates the trained model M(n) corresponding to the type ID of the hierarchy n. Specifically, the generation unit 122A acquires, from the operating database 232, the operating data corresponding to each type ID belonging to the hierarchy n, and learns the acquired operating data for each type ID, thereby generating the trained model M(n) corresponding to each type ID.

In step S802, the generation unit 122A calculates a training error of the trained model M(n). Details of the training error have been described above. In step S803, the generation unit 122A determines whether or not the training error of the trained model M(n) is larger than a threshold. Here, the generation unit 122A may compare the average value of the training errors of the trained models M(n) with the threshold.

When the training error is larger than the threshold (YES in step S803), the generation unit 122A generates a trained model M'(n) corresponding to the individual ID of the hierarchy n (step S804). For example, in step S801, when the trained model M(n) corresponding to the pack type ID is generated, the trained model M'(n) corresponding to the pack individual ID is generated. Specifically, the generation unit 122A acquires, from the operating database 232, the operating data corresponding to each individual ID belonging to the hierarchy n, and learns the acquired operating data for each individual ID, thereby generating the trained model M'(n) of the hierarchy n corresponding to each individual ID.

In step S805, the generation unit 122A calculates the accuracy of the trained model M'(n). In step S806, the generation unit 122A determines whether or not the accuracy is equal to or more than the reference accuracy. Here, the generation unit 122A may compare the average value of the accuracy of each trained model M'(n) with the reference accuracy. Details of the accuracy have been described above.

When the accuracy is equal to or larger than the reference accuracy (YES in step S806), the generation unit 122A determines the individual ID of the hierarchy n as the learning target (step S808). This thereafter generates and updates the trained model using the operating data corresponding to the individual ID of the hierarchy n.

In step S803, when the training error is equal to or less than the threshold (NO in step S803), the generation unit 122A determines the hierarchy n as the learning target (step S807). This thereafter generates and updates the trained model using the operating data corresponding to the type ID of the hierarchy n.

In step S806, when the accuracy is less than the reference accuracy (NO in step S806), the generation unit 122A determines another hierarchy n (step S809), and returns the process to step S801. As another hierarchy n, a hierarchy one level higher than the hierarchy n determined in step S801 may be determined, or a hierarchy one level lower than the hierarchy n may be determined.

In this manner, according to the second example, when the training error of the trained model is larger than the threshold, the trained model of a lower hierarchy is generated, and when the training error of the trained model is equal to or less than the threshold and the accuracy is equal to or more than the reference accuracy, the lower hierarchy is determined as the learning target. Therefore, it is possible to search for the hierarchy in which the training cost of the trained model is the smaller than the threshold and the trained model having an accuracy equal to or higher than the reference accuracy is obtained. Note that the second example adopts an algorithm for lowering the hierarchy so that the training error becomes equal to or less than the threshold, and therefore it is suitable for searching for the hierarchy of the trained model for estimating the SOH or the sign of failure.

Modification

The present disclosure may generate a trained model corresponding to a cell individual ID.

INDUSTRIAL APPLICABILITY

The present disclosure is useful in a technique for generating a trained model capable of highly accurately estimating the state of a battery.

The invention claimed is:

1. A manufacturing method of a trained model in a generation device that generates the trained model of a battery including a plurality of components configured hierarchically, the manufacturing method comprising:

by a processor of the generation device, acquiring one or more pieces of identification information imparted to a component of a certain hierarchy among the plurality of components, acquiring operating data of the battery corresponding to each piece of identification information, generating a trained model corresponding to each piece of identification information for estimating a state of the battery by learning, for each of the one or more pieces of identification information, the operating data having been acquired, and outputting the trained model having been generated, wherein in the generation, based on operating data corresponding to one or more pieces of first identification information in a first hierarchy a first trained model corresponding to each piece of first identification information is generated, a training cost of the first trained model is calculated, and when the training cost having been calculated is larger than a threshold, based on operating data corresponding to one or more pieces of second identification information in a second hierarchy higher than the first hierarchy a second trained model corresponding to each piece of second identification information is generated.

2. The manufacturing method according to claim 1, wherein each piece of identification information is identifiably imparted with a type and a number of components in a lower hierarchy.

3. A manufacturing method of a trained model in a generation device that generates the trained model of a battery including a plurality of components configured hierarchically, the manufacturing method comprising:

by a processor of the generation device, acquiring one or more pieces of identification information imparted to a component of a certain hierarchy among the plurality of components, acquiring operating data of the battery corresponding to each piece of identification information, generating a trained model corresponding to each piece of identification information for estimating a state of the battery by learning, for each of the one or more pieces of identification information, the operating data having been acquired, and outputting the trained model having been generated, wherein in the generation, based on operating data corresponding to one or more pieces of first identification information in a first hierarchy a first trained model corresponding to each piece of first identification information is generated, a training error of the first trained model is calculated, and when the training error having been calculated is larger than a threshold, based on operating data corresponding to one or more pieces of second identification information in a second hierarchy lower than the first hierarchy a second trained model corresponding to each piece of second identification information is generated.

4. The manufacturing method according to claim 1, wherein the plurality of components include a first component and a second component having a hierarchy different from a hierarchy of the first component, the one or more pieces of first identification information are information for identifying the first component, and the one or more pieces of second identification information are information for identifying the second component.

5. The manufacturing method according to claim 1, wherein in the generation, when the training cost of the first trained model is equal to or less than the threshold, the first trained model is determined as the trained model of a learning target.

6. The manufacturing method according to claim 1, wherein in the generation, when an accuracy of the second trained model is lower than a reference accuracy, based on operating data corresponding to one or more pieces of third identification information of a third hierarchy different from the first hierarchy and the second hierarchy a third trained model corresponding to each piece of third identification information is generated.

7. The manufacturing method according to claim 1, wherein in the generation, when an accuracy of the second trained model is higher than a reference accuracy, the second trained model is determined as the trained model of a learning target.

8. The manufacturing method according to claim 1, wherein the training cost is calculated based on at least any one of a number of models of the trained models having been generated, a data amount of operating data used for generation of the trained model, and a processing load of the processor when generating the trained model.

9. The manufacturing method according to claim 1, wherein the one or more pieces of identification information include one or more pieces of type identification information for identifying each component by type.

10. The manufacturing method according to claim 1, wherein each piece of identification information includes one or more pieces of individual identification information for identifying each component individually.

11. The manufacturing method according to claim 1, wherein the plurality of components include a cell, a block including the cell, a module including the block, and a battery pack including the module.

12. A generation device that generates a trained model of a battery including a plurality of components configured hierarchically, the generation device comprising a processor, wherein the processor executes processing of acquiring one or more pieces of identification information imparted to a component of a certain hierarchy among the plurality of components, acquiring operating data corresponding to each piece of identification information, generating the trained model corresponding to each piece of identification information for estimating a state of the battery by learning, for each of the one or more pieces of identification information, the operating data having been acquired, and outputting the trained model having been generated, in the generation, based on operating data corresponding to one or more pieces of first identification information in a first hierarchy a first trained model corresponding to each piece of first identification information is generated, a training cost of the first trained model is calculated, and when the training cost having been calculated is larger than a threshold, based on operating data corresponding to one or more pieces of second identification information in a second hierarchy higher than the first hierarchy a second trained model corresponding to each piece of second identification information is generated.

13. An estimation device that estimates a state of a battery including a plurality of components configured hierarchically, the estimation device comprising a processor, wherein the processor executes processing of acquiring operating data of the battery, inputting the operating data into a trained model to estimate a state of the battery, and outputting state information indicating an estimated state, and the trained model is a model generated by learning, for each of one or more pieces of identification information, the operating data corresponding to the one or more pieces of identification information imparted to a component of a certain hierarchy among the plurality of components, in the generation of the model, based on operating data corresponding to one or more pieces of first identification information in a first hierarchy a first trained model corresponding to each piece of first identification information is generated, a training cost of the first trained model is calculated, and when the training cost having been calculated is larger than a threshold, based on operating data corresponding to one or more pieces of second identification information in a second hierarchy higher than the first hierarchy a second trained model corresponding to each piece of second identification information is generated.

14. A generation device that generates a trained model of a battery including a plurality of components configured hierarchically, the generation device comprising a processor, wherein the processor executes processing of acquiring one or more pieces of identification information imparted to a component of a certain hierarchy among the plurality of components, acquiring operating data corresponding to each piece of identification information, generating a trained model corresponding to each piece of identification information for estimating a state of the battery by learning, for each of the one or more pieces of identification information, the operating data having been acquired, and outputting the trained model having been generated, in the generation, based on operating data corresponding to one or more pieces of first identification information in a first hierarchy a first trained model corresponding to each piece of first identification information is generated, a training error of the first trained model is calculated, and when the training error having been calculated is larger than a threshold, based on operating data corresponding to one or more pieces of second identification information in a second hierarchy lower than the first hierarchy a second trained model corresponding to each piece of second identification information is generated.

15. An estimation device that estimates a state of a battery including a plurality of components configured hierarchically, the estimation device comprising a processor, wherein the processor executes processing of acquiring operating data of the battery, inputting the operating data into a trained model to estimate a state of the battery, and outputting state information indicating an estimated state, and the trained model is a model generated by learning, for each of one or more pieces of identification information, the operating data corresponding to the one or more pieces of identification information imparted to a component of a certain hierarchy among the plurality of components, in the generation of the model, based on operating data corresponding to one or more pieces of first identification information in a first hierarchy a first trained model corresponding to each piece of first identification information is generated, a training error of the first trained model is calculated, and when the training error having been calculated is larger than a threshold, based on operating data corresponding to one or more pieces of second identification information in a second hierarchy lower than the first hierarchy a second trained model corresponding to each piece of second identification information is generated.

* * * * *